(12) United States Patent
Roberts et al.

(10) Patent No.: US 12,664,333 B2
(45) Date of Patent: Jun. 23, 2026

(54) SYSTEMS AND METHODS FOR GENERATING BLEND REPAIR MODELS

(71) Applicant: RAYTHEON TECHNOLOGIES CORPORATION, Farmington, CT (US)

(72) Inventors: Lawrence P Roberts, North Palm Beach, FL (US); Adam F. Knapp, Manchester, CT (US); William D Owen, Windsor, CT (US); Ross A. Vandenbosch, Berwick, ME (US)

(73) Assignee: RTX CORPORATION, Farmington, CT (US)

( * ) Notice: Subject to any disclaimer, the term of this patent is extended or adjusted under 35 U.S.C. 154(b) by 892 days.

(21) Appl. No.: 17/730,104

(22) Filed: Apr. 26, 2022

(65) Prior Publication Data

US 2023/0315948 A1 Oct. 5, 2023

Related U.S. Application Data

(60) Provisional application No. 63/327,748, filed on Apr. 5, 2022.

(51) Int. Cl.
  *G06F 30/23* (2020.01)
  *G06F 30/15* (2020.01)
(52) U.S. Cl.
  CPC .............. *G06F 30/23* (2020.01); *G06F 30/15* (2020.01)
(58) Field of Classification Search
  CPC .......... G06F 30/23; G06F 30/15; F01D 5/005; F01D 21/003; G01M 15/14; F05D 2230/80; F05D 2260/80
  See application file for complete search history.

(56) References Cited

U.S. PATENT DOCUMENTS 4,811,253 A 3/1989 Johns
4,858,146 A 8/1989 Shebini
(Continued)

FOREIGN PATENT DOCUMENTS

CA 3173329 7/2021
CN 110362957 10/2019
(Continued)

OTHER PUBLICATIONS

USPTO; Non-Final Office Action dated Mar. 26, 2025 in U.S. Appl. No. 17/730,131.
(Continued)

*Primary Examiner* — Courtney D Heinle
*Assistant Examiner* — Andrew Thanh Bui
(74) *Attorney, Agent, or Firm* — SNELL & WILMER L.L.P.

(57) ABSTRACT

An article of manufacture may include a tangible, non-transitory computer-readable storage medium having instructions stored thereon that, in response to execution by a processor, cause the processor to perform operations comprising: receiving, via the processor, one of a point cloud and a three-dimensional model for an inspected integrally bladed rotor (IBR) and a defect including a defect shape, a defect size, and a defect location; generating, via the processor, a first finite element model and a second finite element model based on the point cloud or the three-dimensional model, the first finite element model and the second finite element model; performing, via the processor, a structural analysis simulation with the first finite element model; performing, via the processor an aerodynamic analysis simulation with the second finite element model; iterating, via the processor, a repaired defect shape based on simulation data from the aerodynamic analysis simulation
(Continued)

and the structural analysis simulation; and determining a repair process for the defect based on the iterating.

20 Claims, 18 Drawing Sheets

(56)                    References Cited

U.S. PATENT DOCUMENTS

| | | |
|---|---|---|
| 4,955,269 A | 9/1990 | Kendig et al. |
| 5,253,978 A | 10/1993 | Fraser |
| 5,993,161 A | 11/1999 | Shapiro et al. |
| 6,814,543 B2 | 11/2004 | Barb et al. |
| 6,915,236 B2 | 7/2005 | Tanner et al. |
| 7,068,301 B2 | 6/2006 | Thompson |
| 7,082,371 B2 | 7/2006 | Griffin et al. |
| 7,206,709 B2 | 4/2007 | Griffin et al. |
| 7,810,385 B1 | 10/2010 | Narcus |
| 8,024,137 B2 | 9/2011 | Kuehhorn et al. |
| 8,045,144 B2 | 10/2011 | Manfred |
| 8,255,170 B2 | 8/2012 | Kollgaard et al. |
| 8,881,392 B2 | 11/2014 | Derrien et al. |
| 9,036,892 B2 | 5/2015 | Domke et al. |
| 9,477,224 B2 | 10/2016 | Khan et al. |
| 9,483,605 B2 | 11/2016 | Morris et al. |
| 9,739,167 B2 | 8/2017 | Heinig et al. |
| 9,984,474 B2 | 5/2018 | Bendall et al. |
| 10,013,752 B2 | 7/2018 | Salm et al. |
| 10,156,140 B2 | 12/2018 | Walker et al. |
| 10,174,623 B2 | 1/2019 | Scott |
| 10,191,478 B2 | 1/2019 | Georgeson et al. |
| 10,360,326 B2 | 7/2019 | Lamicq |
| 10,378,455 B2 | 8/2019 | Bengea et al. |
| 10,379,020 B2 | 8/2019 | Sever et al. |
| 10,633,976 B2 | 4/2020 | Nissen et al. |
| 10,762,255 B2 | 9/2020 | Feiner et al. |
| 10,955,815 B2 | 3/2021 | Auxier et al. |
| 11,268,881 B2 | 3/2022 | Finn et al. |
| 11,407,035 B2 | 8/2022 | Shi et al. |
| 11,434,764 B2 | 9/2022 | Morris et al. |
| 11,447,271 B2 | 9/2022 | Somanath et al. |
| 11,703,322 B2 | 7/2023 | Yin et al. |
| 11,840,032 B2 | 12/2023 | Rahman et al. |
| 11,865,655 B2 | 1/2024 | Griffin et al. |
| 12,115,598 B2 | 10/2024 | Tracy et al. |
| 2004/0148129 A1 | 7/2004 | Gotoh et al. |
| 2004/0225474 A1 | 11/2004 | Goldfine et al. |
| 2004/0243310 A1 | 12/2004 | Griffin et al. |
| 2005/0033555 A1 | 2/2005 | Tanner et al. |
| 2006/0073022 A1* | 4/2006 | Gentile .................. F01D 5/141 |
| | | 416/223 R |
| 2007/0005527 A1 | 1/2007 | Parthasarathy |
| 2008/0250659 A1 | 10/2008 | Bellerose et al. |
| 2009/0089020 A1 | 4/2009 | Boyer et al. |
| 2010/0064515 A1 | 3/2010 | Eichmann et al. |
| 2010/0153080 A1 | 6/2010 | Khan et al. |
| 2011/0166798 A1 | 7/2011 | Knodel et al. |
| 2013/0158832 A1* | 6/2013 | Moeckly .................. F02C 9/00 |
| | | 701/101 |
| 2013/0170947 A1 | 7/2013 | Kurt-Elli et al. |
| 2014/0030092 A1 | 1/2014 | Heining et al. |
| 2014/0100703 A1 | 4/2014 | Dull et al. |
| 2014/0114587 A1 | 4/2014 | Czerniak et al. |
| 2015/0160164 A1 | 6/2015 | Plotnikov et al. |
| 2016/0246287 A1 | 8/2016 | Modgil |
| 2017/0176342 A1 | 6/2017 | Colletti |
| 2017/0370220 A1 | 12/2017 | Morris et al. |
| 2018/0341836 A1 | 11/2018 | Lim et al. |
| 2019/0338666 A1 | 11/2019 | Finn et al. |
| 2019/0339165 A1 | 11/2019 | Finn et al. |
| 2020/0004225 A1 | 1/2020 | Buller |
| 2020/0102827 A1 | 4/2020 | Morris et al. |
| 2020/0159879 A1 | 5/2020 | Feiner et al. |
| 2020/0182604 A1 | 6/2020 | Kocic |
| 2022/0001500 A1 | 1/2022 | Rahman et al. |
| 2022/0099067 A1 | 3/2022 | Packer |
| 2022/0100919 A1 | 3/2022 | Chakrabarti et al. |
| 2022/0161326 A1 | 5/2022 | Nelson et al. |
| 2022/0266399 A1* | 8/2022 | Griffin ................ G01M 5/0016 |
| 2023/0304878 A1 | 9/2023 | Drodofsky et al. |

FOREIGN PATENT DOCUMENTS

| | | |
|---|---|---|
| EP | 2655005 | 10/2014 |
| EP | 3220119 | 9/2017 |
| EP | 2507009 | 11/2017 |
| EP | 3705726 | 9/2020 |
| EP | 3979120 | 4/2022 |
| WO | 2012001852 | 1/2012 |
| WO | 20170192998 | 11/2017 |
| WO | 2020053778 | 3/2020 |
| WO | 2021150579 | 7/2021 |

OTHER PUBLICATIONS

USPTO; Final Office Action dated Apr. 3, 2025 in U.S. Appl. No. 17/862,194.

European Patent Office, European Search Report dated Nov. 4, 2024 in Application No. 24169808.3.

USPTO; Notice of Allowance dated Feb. 6, 2025 in U.S. Appl. No. 17/730,086.

USPTO; Requirement for Restriction/ Election dated Jan. 27, 2025 in U.S. Appl. No. 17/730,131.

USPTO; Notice of Allowance dated Apr. 17, 2024 in U.S. Appl. No. 17/845,656.

USPTO; Non-Final Office Action dated Dec. 16, 2024 in U.S. Appl. No. 17/862,194.

USPTO; Non-Final Office Action dated Nov. 22, 2024 in U.S. Appl. No. 18/114,890.

European Patent Office, European Partial Search Report dated Aug. 14, 2023 in Application No. 23164760.3.

European Patent Office, European Search Report dated Aug. 14, 2023 in Application No. 23164481.6.

European Patent Office, European Search Report dated Aug. 10, 2023 in Application No. 23164480.8.

European Patent Office, European Search Report dated Aug. 10, 2023 in Application No. 23164474.1.

European Patent Office, European Search Report dated Aug. 22, 2023 in Application No. 23166849.2.

European Patent Office, European Search Report dated Aug. 29, 2023 in Application No. 23166874.0.

Khemiri, et al: "Asymtotic description of damping mistuning effects on the forced response of turbomachinery bladed disk", Journal of Sound and Vibration, vol. 332, No. 20, pp. 4998-5013, Dated May 20, 2013.

Ganine, et al: "A sparse preconditioned iterative method for vibration analysis of geometrically mistuned bladed disk" , Computers and Structures, Pergamon Press, GB vol. 87, No. 5-6, pp. 342-354, dated Mar. 1, 2009.

Rodriguez, et al: "Analysis of expirimental results of turbomachinery fluttes using an asymptotic reduced order model", Journal of Sound and Vibration, Elsevier, Amsterdam, NL, vol. 509, 15 pages dated May 25, 2021.

Beck, et al. "Probabilistic Study of Intergrally Bladed Rotor Blends using Geometric Mistuning Models" 58th AIAA/ASCE/AHS/ASC Structures, Structural Dynamics, and Materials Confrence, 12 pages dated Jan. 5, 2017.

European Patent Office, European Search Report dated Aug. 29, 2023 in Application No. 23166868.2.

European Patent Office, European Search Report dated Aug. 14, 2023 in Application No. 23164852.8.

USPTO; Non-Final Office Action dated May 4, 2023 in U.S. Appl. No. 17/730,120.

USPTO; Notice of Allowance dated Sep. 1, 2023 in U.S. Appl. No. 17/730,120.

USPTO; Notice of Allowance dated Feb. 28, 2025 in U.S. Appl. No. 17/730,086.

USPTO; Non-Final Office Action dated Oct. 15, 2024 in U.S. Appl. No. 17/730,086.

(56) References Cited

OTHER PUBLICATIONS

USPTO; Requirement for Restriction dated Jun. 21, 2024 in U.S. Appl. No. 17/730,086.
European Patent Office, European Search Report dated Oct. 19, 2023 in Application No. 23176124.8.
USPTO; Non-Final Office Action dated Nov. 22, 2023 in U.S. Appl. No. 17/845,656.
USPTO; Corrected Notice of Allowance dated Nov. 9, 2023 in U.S. Appl. No. 17/730,120.
European Patent Office, European Search Report dated Nov. 14, 2023 in Application No. 23164760.3.
European Patent Office, European Search Report dated Aug. 22, 2023 in Application No. 23166856.7.
European Patent Office, European Search Report dated Aug. 29, 2023 in Application No. 23166872.4.
European Patent Office, European Search Report dated Aug. 22, 2023 in Application No. 23166863.3.
European Patent Office, European Search Report dated Aug. 29, 2023 in Application No. 23166864.1.
USPTO; Corrected Notice of Allowance dated Oct. 16, 2023 in U.S. Appl. No. 17/730,120.
European Patent Office, European Search Report dated Aug. 29, 2023 in Application No. 23164478.2.
Bai Bin et al: "Application of multi-stage multi-objective multi-disciplinary agent model based on dynamic substructural method in Mistuned Blisk", Aerospace Science and Technology, Elsevier Masson, FR, vol. 46, Jul. 8, 2015, pp. 104-115, DOI: 10.1016/J.AST.2015.06.030.
D'Souza Kiran et al: "Analyzing mistuned multi-stage turbomachinery rotors with aerodynamic effects", Journal of Fluids and Structures, Academic Press, Amsterdam, NL, vol. 42, Aug. 17, 2013, pp. 388-400, DOI: 10.1016/J.JFLUIDSTRUCTS.2013.07.007.
Nyssen Fet Al: "Experimental modal identification of mistuning in an academic two-stage drum", Mechanical Systems and Signal Processing, vol. 88, Nov. 14, 2016 (Nov. 14, 2016), pp. 428-444, DOI: 10.1016/J.YMSSP.2016.10.030.
USPTO; Notice of Allowance dated May 20, 2025 in U.S. Appl. No. 18/114,890.
European Patent Office, European Office Action dated Apr. 4, 2025 in Application No. 23164760.3.
European Patent Office, European Office Action dated Mar. 24, 2025 in Application No. 23164481.6.
European Patent Office, European Office Action dated Mar. 24, 2025 in Application No. 23164480.8.
European Patent Office, European Office Action dated Mar. 19, 2025 in Application No. 23164474.1.
European Patent Office, European Office Action dated Apr. 10, 2025 in Application No. 23166856.7.
European Patent Office, European Office Action dated Mar. 24, 2025 in Application No. 23166863.3.
European Patent Office, European Office Action dated Mar. 24, 2025 in Application No. 23166849.2.
European Patent Office, European Office Action dated Mar. 24, 2025 in Application No. 23164852.8.
USPTO; Advisory Action dated May 30, 2025 in U.S. Appl. No. 17/862,194.
USPTO; Notice of Allowance dated Sep. 16, 2025 in U.S. Appl. No. 17/730,131.
USPTO; Notice of Allowance dated Sep. 24, 2025 in U.S. Appl. No. 17/730,131.
European Patent Office, European Office Action dated Aug. 21, 2025 in Application No. 23164478.2.
European Patent Office, European Office Action dated Aug. 21, 2025 in Application No. 23166864.1.
USPTO; Notice of Allowance dated Dec. 8, 2025 in U.S. Appl. No. 17/730,131.
USPTO; Non-Final Office Action dated Nov. 24, 2025 in U.S. Appl. No. 17/730,128.
European Patent Office, European Office Action dated Aug. 21, 2025 in Application No. 23166874.0.
European Patent Office, European Office Action dated Aug. 21, 2025 in Application No. 23166868.2.
USPTO; Non-Final Office Action dated Jul. 29, 2025 in U.S. Appl. No. 17/862,194.
USPTO; Non-Final Office Action dated Aug. 13, 2025 in U.S. Appl. No. 17/862,207.
USPTO; Non-Final Office Action dated Oct. 23, 2025 in U.S. Appl. No. 17/885,868.
USPTO; Non-Final Office Action dated Oct. 22, 2025 in U.S. Appl. No. 17/900,716.
USPTO; Notice of Allowance dated Oct. 31, 2025 in U.S. Appl. No. 17/730,131.
USPTO; Final Office Action dated Nov. 14, 2025 in U.S. Appl. No. 17/862,194.
USPTO; Non-Final Office Action dated Feb. 17, 2026 in U.S. Appl. No. 17/862,168.
USPTO; Final Office Action dated Feb. 5, 2026 in U.S. Appl. No. 17/862,207.
European Patent Office, European Office Action dated May 4, 2026 in Application No. 23166863.3.
USPTO; Notice of Allowance dated Apr. 6, 2026 in U.S. Appl. No. 17/862,194.
USPTO; Advisory Action dated Jan. 27, 2026 in U.S. Appl. No. 17/862,194.
USPTO; Notice of Allowance dated Apr. 24, 2026 in U.S. Appl. No. 17/862,194.
USPTO; Notice of Allowance dated May 11, 2026 in U.S. Appl. No. 17/862,194.
USPTO; Notice of Allowance dated May 18, 2026 in U.S. Appl. No. 17/862,194.
USPTO; Advisory Action dated Apr. 23, 2026 in U.S. Appl. No. 17/862,207.
USPTO; Notice of Allowance dated Apr. 23, 2026 in U.S. Appl. No. 17/900,716.

* cited by examiner

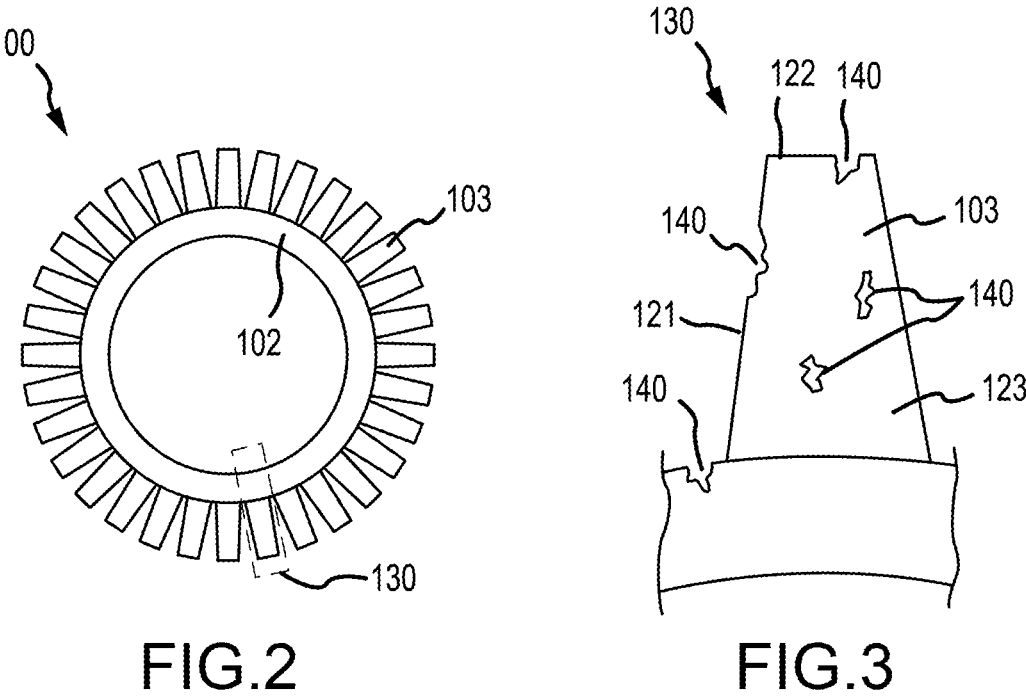
FIG.2          FIG.3
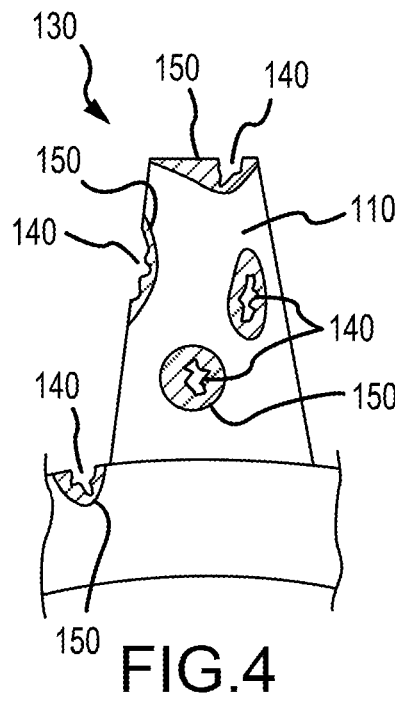
FIG.4

SECT A-A

SECT B-B

700

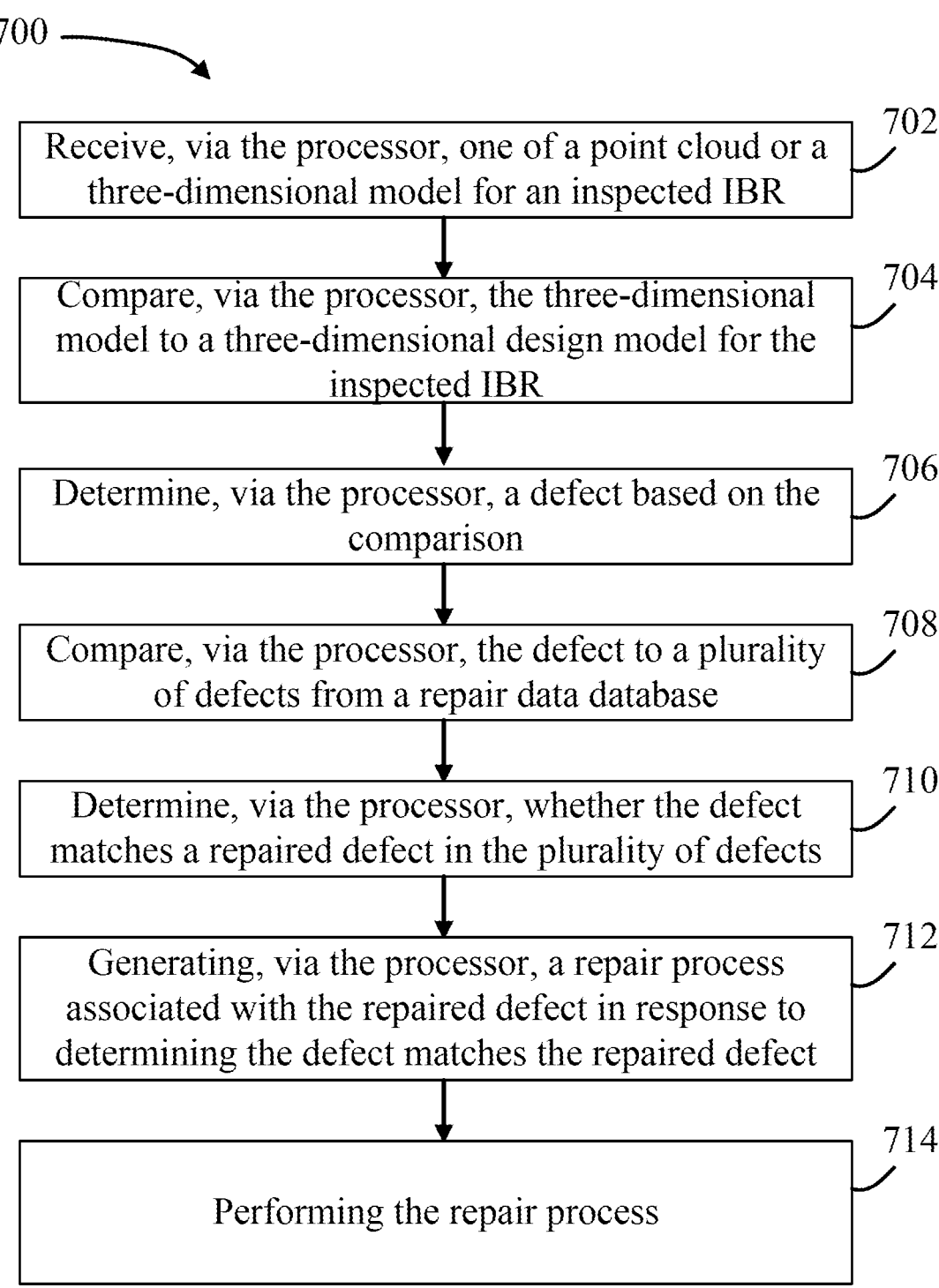

Receive, via the processor, one of a point cloud or a three-dimensional model for an inspected IBR

702

Compare, via the processor, the three-dimensional model to a three-dimensional design model for the inspected IBR

704

Determine, via the processor, a defect based on the comparison

706

Compare, via the processor, the defect to a plurality of defects from a repair data database

708

Determine, via the processor, whether the defect matches a repaired defect in the plurality of defects

710

Generating, via the processor, a repair process associated with the repaired defect in response to determining the defect matches the repaired defect

712

Performing the repair process

Receive, via the processor, a unique identifier for the inspected IBR — 802

Steps 702, 704, 706

Select, via the processor, a plurality of inspected IBRs based on a location of the defect — 902

Repeat steps 804, 806, 808, 810, 812, 712, 714

Performing process 800 or process 900

Certifying a repair process for the stack of IBRs — 1002

Generating, via the processor, a list of unique identifiers in the certified stack of IBRs — 1004

Repairing each IBR in the stack of IBRs based on an associated repair process from process 800, 900 — 1006

Assembling the compressor section with the certified stack of IBRs after repair — 1008

1100

Steps 702, 704, 706, 708, and/or 710 of process 700

Determining, via the processor, a repair process for a defect for the inspected IBR — 1102

Generating, via the processor, a finite element model of the inspected IBR with a repaired defect — 1104

1106
Perform structural analysis simulation

1108
Perform aerodynamic analysis simulation

1112
Are structural and aerodynamic criteria met? — NO

YES

Steps 712, 714 of process 700

SYSTEMS AND METHODS FOR GENERATING BLEND REPAIR MODELS

CROSS-REFERENCE TO RELATED APPLICATIONS

This application is a non-provisional of, and claims priority to, and the benefit of U.S. Provisional Application No. 63/327,748, entitled "BLADED ROTOR INSPECTION, ANALYSIS AND REPAIR SYSTEMS AND METHODS," filed on Apr. 5, 2022, which is hereby incorporated by reference in its entirety.

FIELD

The present disclosure relates to repair analysis methods and systems, and more particularly, the repair analysis systems and methods for bladed rotors of gas turbine engines.

BACKGROUND

Gas turbine engines (such as those used in electrical power generation or used in modern aircraft) typically include a compressor, a combustor section, and a turbine. The compressor and the turbine typically include a series of alternating rotors and stators. A rotor generally comprises a rotor disk and a plurality of blades. The rotor may be an integrally bladed rotor ("IBR") or a mechanically bladed rotor.

The rotor disk and blades in the IBR are one piece (i.e., monolithic, or nearly monolithic) with the blades spaced around the circumference of the rotor disk. Conventional IBRs may be formed using a variety of technical methods including integral casting, machining from a solid billet, or by welding or bonding the blades to the rotor disk.

Repair methods for IBRs may be limited to maintaining the IBR within tolerances of a product definition for a design of the IBR, a volume or thickness of material addition, and/or a volume or thickness of material removal. Additionally, repair analysis methods for IBRs may fail to consider loads and/or boundary conditions encountered during engine operation included in the aerodynamic, structural, or other functional assessment of the IBR. In this regard, a damaged IBR may be scrapped because it is believed to unrepairable within the geometric assessment constraints (e.g., tolerances, material removal, material addition, etc.) without consideration of the functional assessment constraints (e.g., aerodynamic stability, structural durability, etc.). By being limited in this manner, less expensive repair options and/or more optimal repairs (e.g., in terms of aerodynamic or structural capability, etc.) that could otherwise be acceptable may be avoided.

SUMMARY

An article of manufacture is disclosed herein. The article of manufacture may include a tangible, non-transitory computer-readable storage medium having instructions stored thereon that, in response to execution by a processor, cause the processor to perform operations comprising: receiving, via the processor, one of a point cloud and a three-dimensional model for an inspected integrally bladed rotor (IBR) and a defect including a defect shape, a defect size, and a defect location; generating, via the processor, a first finite element model and a second finite element model (e.g., a computation fluid dynamics model) based on the point cloud or the three-dimensional model, the first finite element model and the second finite element model; performing, via the processor, a structural analysis simulation with the first finite element model; performing, via the processor an aerodynamic analysis simulation with the second finite element model; iterating, via the processor, a repaired defect shape based on simulation data from the aerodynamic analysis simulation and the structural analysis simulation; and determining a repair process for the defect based on the iterations.

In various embodiments, the structural analysis simulation and the aerodynamic analysis simulation are based on boundary conditions for a gas turbine engine with the article of manufacture.

In various embodiments, a potential repaired defect shape of the defect is not limited by tolerances of a product definition of an IBR design associated with the inspected IBR.

In various embodiments, both the first finite element model and the second finite element model include a potential repaired defect based on the defect shape, the defect size and the defect location.

In various embodiments, the first finite element model and the second finite element model include a first potential repaired defect and a second potential repaired defect.

In various embodiments, the repair process for the defect is partial repair in response to a structural criteria and an aerodynamic criteria for the inspected IBR being met in the structural analysis simulation and the aerodynamic analysis simulation.

In various embodiments, the structural analysis simulation and the aerodynamic analysis simulation are performed in parallel.

In various embodiments, the operations further comprise scaling, via the processor, stress results from the structural analysis simulation based on engine test data for a tested IBR on a tested gas turbine engine.

A method is disclosed herein. In various embodiments, the method comprises: generating a first finite element model and a second finite element model for an inspected integrally bladed rotor (IBR) based at least in part on a point cloud of the inspected IBR; performing a structural analysis simulation with the first finite element model, the structural analysis simulation including a first set of boundary conditions based on a first set of operating conditions of a gas turbine engine; performing an aerodynamic analysis simulation with the second finite element model, the aerodynamic analysis simulation including a second set of boundary conditions based on a second set of operating conditions of the gas turbine engine; iterating a potential repaired defect shape for a defect of the inspected IBR based on simulation data from the aerodynamic analysis simulation and the structural analysis simulation; and generating a repair option based on the iterating.

In various embodiments, the repair option includes one of a computer numerical control (CNC) instructions, an additive manufacturing instructions, and a manual instruction.

In various embodiments, the method further comprises generating a plurality of repair options.

In various embodiments, the repair option includes coded instructions for a computer numerical control (CNC) machine to perform the repair option.

In various embodiments, the method further comprises transferring the coded instructions to the CNC machine to perform the repair option. In various embodiments, the method further comprises performing the repair option via the coded instructions.

A method is disclosed herein. The method may comprise: determining a first potential repair shape for a first defect of the inspected IBR; determining a second potential repair shape for a second defect of the inspected IBR based on an expected impact to a predetermined parameter; generating a first finite element model and a second finite element model for an inspected integrally bladed rotor (IBR) based at least in part on a point cloud of the inspected IBR, the first finite element model and the second finite element model both including the first potential repair shape for the first defect and the second potential repair shape for the second defect; performing a structural simulation with the first finite element model, the structural simulation including a first set of boundary conditions based on a first set of operating conditions of a gas turbine engine; performing an aerodynamic simulation with the second finite element model, the aerodynamic simulation including a second set of boundary conditions based on a second set of operating conditions of the gas turbine engine; and iterating, the second potential repair shape for the second defect based on the predetermined parameter.

In various embodiments, the method further comprises determining a repair process for the first defect and the second defect based on the iterating.

In various embodiments, the predetermined parameter is an excitation frequency for a blade of the inspected IBR.

In various embodiments, the predetermined parameter is a dynamic stress of the inspected IBR.

In various embodiments, the method further comprises generating a plurality of repair options in response to the iterating.

In various embodiments, the method further comprises repairing the inspected IBR via a repair option from the plurality of repair options.

The foregoing features and elements may be combined in any combination, without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the following detailed description and claims in connection with the following drawings. While the drawings illustrate various embodiments employing the principles described herein, the drawings do not limit the scope of the claims.

FIG. 2 illustrates a front view of a bladed rotor, in accordance with various embodiment;

FIG. 3 illustrates a portion of an inspected bladed rotor, in accordance with various embodiments;

FIG. 4 illustrates a portion of the inspected bladed rotor during repair, in accordance with various embodiments;

FIG. 11 illustrates a process performed by the integrally bladed rotor analysis system, in accordance with various embodiments;

DETAILED DESCRIPTION

The following detailed description of various embodiments herein refers to the accompanying drawings, which show various embodiments by way of illustration. While these various embodiments are described in sufficient detail to enable those skilled in the art to practice the disclosure, it should be understood that other embodiments may be realized and that changes may be made without departing from the scope of the disclosure. Thus, the detailed description herein is presented for purposes of illustration only and not of limitation. Furthermore, any reference to singular includes plural embodiments, and any reference to more than one component or step may include a singular embodiment or step. Also, any reference to attached, fixed, connected, or the like may include permanent, removable, temporary, partial, full or any other possible attachment option. Additionally, any reference to without contact (or similar phrases) may also include reduced contact or minimal contact. It should also be understood that unless specifically stated otherwise, references to "a," "an", or "the" may include one or more than one and that reference to an item in the singular may also include the item in the plural. Further, all ranges may include upper and lower values and all ranges and ratio limits disclosed herein may be combined.

As used herein, "aft" refers to the direction associated with the tail (e.g., the back end) of an aircraft, or generally, to the direction of exhaust of the gas turbine. As used herein, "forward" refers to the direction associated with the nose (e.g., the front end) of an aircraft, or generally, to the direction of flight or motion.

Figure 1A:
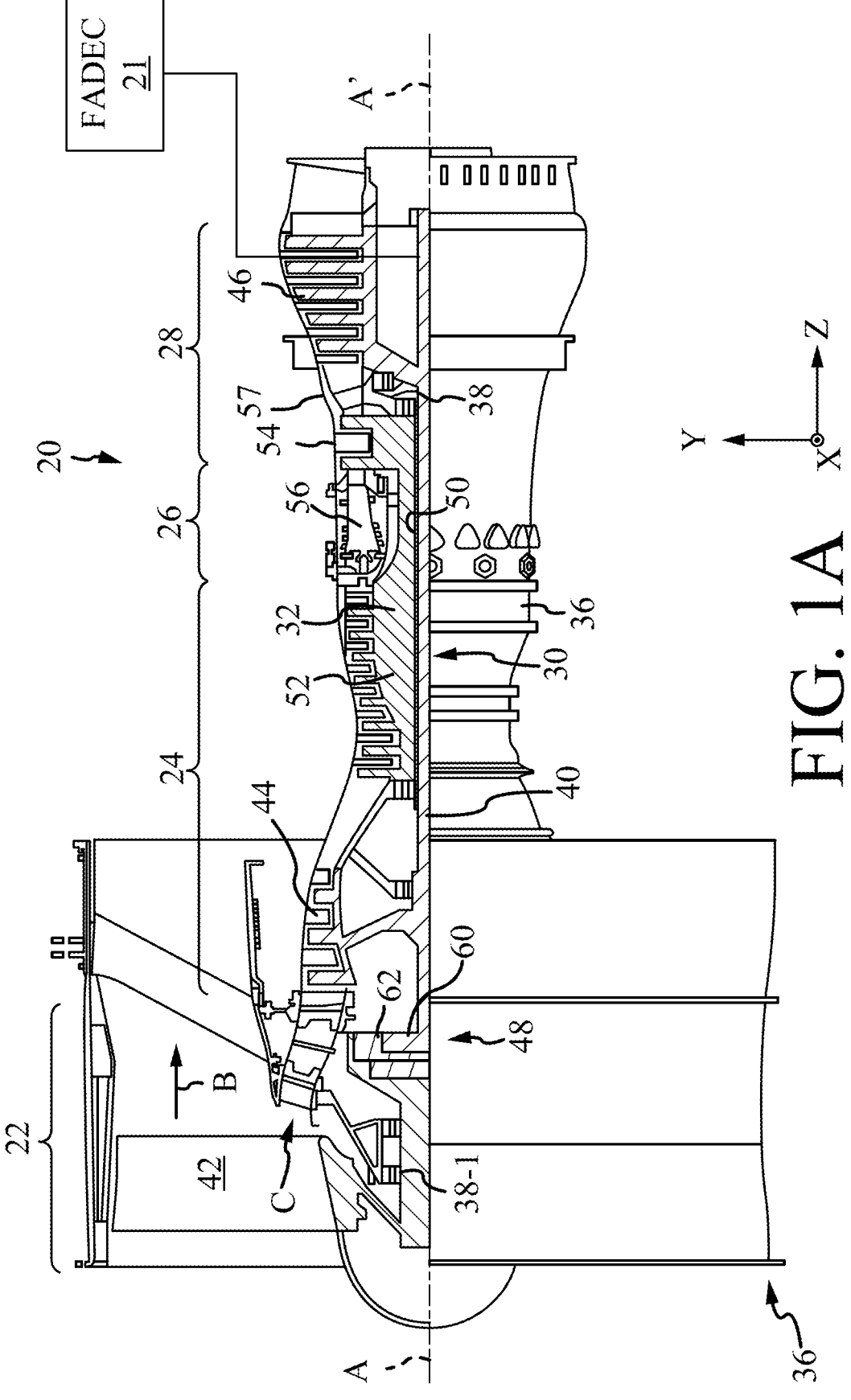
FIG. 1A illustrates a cross-sectional view of a gas-turbine engine, in accordance with various embodiments.

With reference to FIG. 1A, a gas turbine engine 20 is shown according to various embodiments. Gas turbine engine 20 may be a two-spool turbofan that generally incorporates a fan section 22, a compressor section 24, a combustor section 26, and a turbine section 28. In operation, fan section 22 can drive air along a path of bypass airflow B while compressor section 24 can drive air along a core flow path C for compression and communication into combustor section 26 then expansion through turbine section 28. Although depicted as a turbofan gas turbine engine 20 herein, it should be understood that the concepts described herein are not limited to use with turbofans as the teachings may be applied to other types of turbine engines including three-spool architectures, single spool architecture or the like.

Gas turbine engine 20 may generally comprise a low speed spool 30 and a high speed spool 32 mounted for rotation about an engine central longitudinal axis A-A' relative to an engine static structure 36 or engine case via several bearing systems 38, 38-1, etc. Engine central longitudinal axis A-A' is oriented in the Z direction on the provided X-Y-Z axes. It should be understood that various bearing systems 38 at various locations may alternatively or additionally be provided, including for example, bearing system 38, bearing system 38-1, etc.

Low speed spool 30 may generally comprise an inner shaft 40 that interconnects a fan 42, a low pressure compressor 44 and a low pressure turbine 46. Inner shaft 40 may be connected to fan 42 through a geared architecture 48 that can drive fan 42 at a lower speed than low speed spool 30. Geared architecture 48 may comprise a gear assembly 60 enclosed within a gear housing 62. Gear assembly 60 couples inner shaft 40 to a rotating fan structure. High speed spool 32 may comprise an outer shaft 50 that interconnects a high pressure compressor 52 and high pressure turbine 54. A combustor 56 may be located between high pressure compressor 52 and high pressure turbine 54. A mid-turbine frame 57 of engine static structure 36 may be located generally between high pressure turbine 54 and low pressure turbine 46. Mid-turbine frame 57 may support one or more bearing systems 38 in turbine section 28. Inner shaft 40 and outer shaft 50 may be concentric and rotate via bearing systems 38 about the engine central longitudinal axis A-A', which is collinear with their longitudinal axes. As used herein, a "high pressure" compressor or turbine experiences a higher pressure than a corresponding "low pressure" compressor or turbine.

The core airflow may be compressed by low pressure compressor 44 then high pressure compressor 52, mixed and burned with fuel in combustor 56, then expanded over high pressure turbine 54 and low pressure turbine 46. Turbines 46, 54 rotationally drive the respective low speed spool 30 and high speed spool 32 in response to the expansion.

In various embodiments, the gas turbine engine 20 further comprises a Full-Authority Digital Engine Control (FADEC) system 21. The FADEC system 21 includes one or more processors and one or more tangible, non-transitory memories configured to implement digital or programmatic logic. In various embodiments, the FADEC is configured to control the gas turbine engine 40 (i.e., a load system of the gas turbine engine). In various embodiments, the FADEC can control a rotor speed of the low pressure compressor 44, the high pressure compressor 52, or the like.

Figure 1B:
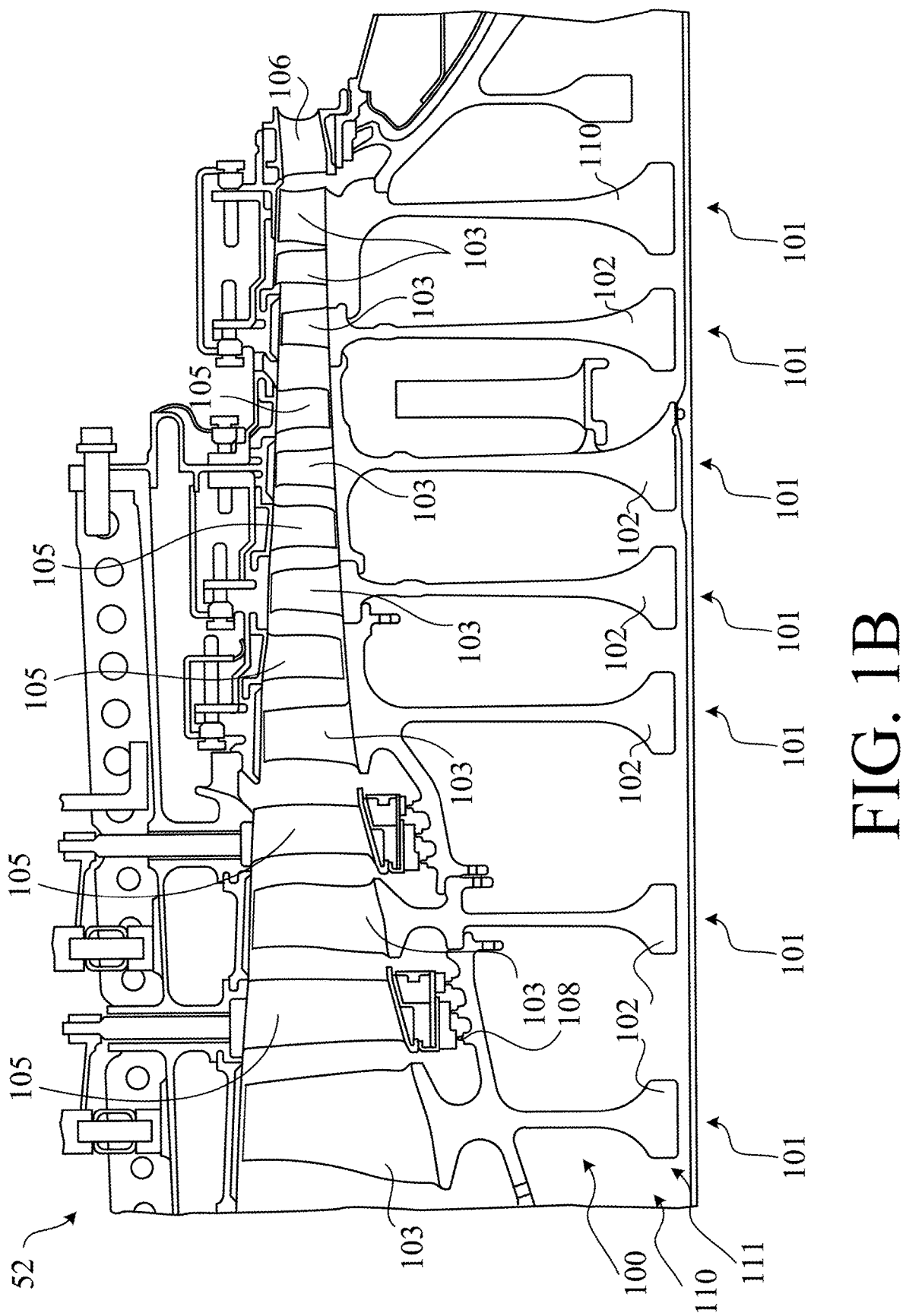
FIG. 1B illustrates a cross-sectional view of a high pressure compressor, in accordance with various embodiments.

In various embodiments, and with reference to FIG. 1B, high pressure compressor 52 of the compressor section 24 of gas turbine engine 20 is provided. The high pressure compressor 52 includes a plurality of blade stages 101 (i.e., rotor stages) and a plurality of vane stages 105 (i.e., stator stages). The blade stages 101 may each include an integrally bladed rotor ("IBR") 100, such that the blades 103 and rotor disks 102 are formed from a single integral component (i.e., a monolithic component formed of a single piece). Although described herein with respect to an IBR 100, the present disclosure is not limited in this regard. For example, the inspection, analysis, and repair systems disclosed herein can be utilized with bladed rotors formed of separate blades 103 and rotor disks 102 and still be within the scope of this disclosure.

The blades 103 extend radially outward from the rotor disk 102. The gas turbine engine 20 may further include an exit guide vane stage 106 that defines the aft end of the high pressure compressor 52. Although illustrated with respect to high pressure compressor 52, the present disclosure is not limited in this regard. For example, the low pressure compressor 44 may include a plurality of blade stages 101 and vane stages 105, each blade stage in the plurality of blade stages 101 including the IBR 100 and still be within the scope of this disclosure. In various embodiments, the plurality of blade stages 101 form a stack of IBRs 110, which define, at least partially, a rotor module 111 of the high pressure compressor 52 of the gas turbine engine 20.

Referring now to FIG. 2, a front view of an IBR 100 is illustrated, in accordance with various embodiments. The IBR 100 includes a rotor disk 102 and a plurality of blades 103 extending radially outward from the rotor disk 102.

When debris is ingested into the gas turbine engine 20, the debris can pass into the primary flowpath. Due to the rotation of the blades 10 in the primary flowpath, the debris can contact one or more of the blades 103. This contact can cause damage or wear to a blade 103, or a set of the blades 103. Disclosed herein is systems and methods for inspection, analysis, and repair of an IBR 100 and for returning an IBR 100 back to service after use. The systems and methods disclosed herein facilitate faster dispositions the more the process is utilized. In this regard, the systems and methods disclosed herein provide a feedback system for continuous improvement of the repair process, in accordance with various embodiments.

With combined reference to FIGS. 2 and 3, a damaged portion 130 from FIG. 2 of an IBR 100 including a substantial number of defects 140 (e.g., damage, wear, etc.) resulting from use of the IBR 100 in the gas turbine engine 20 from FIG. 1A over time. The size and shape of the defects 140 illustrated in FIG. 3 are exaggerated for illustrative effect. Further, the defects 140 can extend to all of the blades 103 of the IBR 100, the rotor disk 102, a set of the blades 103 of the IBR 100, a single blade in the blades 103, or the like.

In order to repair the defect 140, a blending operation can be performed on the IBR 100. A blending operation uses a material removal process, such as milling or computer numerical control (CNC) machining, to remove the damaged portion of the IBR 100 and smooth the resulting voids such that the IBR 100 can be re-introduced into service for further use.

Referring now to FIG. 4, the damaged portion 130 with an additional blending mask 150 applied to each of the locations of the defects 140 is illustrated, in accordance with various embodiments. As with the locations of the defects 140, the blending masks 150 are highly exaggerated in scale for explanatory effect. The blending masks 150 can be physical masking applied to the IBR 100, or shaded colors on computer simulations of the IBR 100. In either case, the blending masks 150 indicate what portions of the material of the blade 103 and/or the rotor disk 102 should be removed in order for the IBR 100 to be suitable for utilization in the gas turbine engine 20 after blending. The blending mask 150 ensures that accurate and consistent blends are made in operations that require or utilize manual removal of material.

Figures 5A, 5B, 5C, 5D:
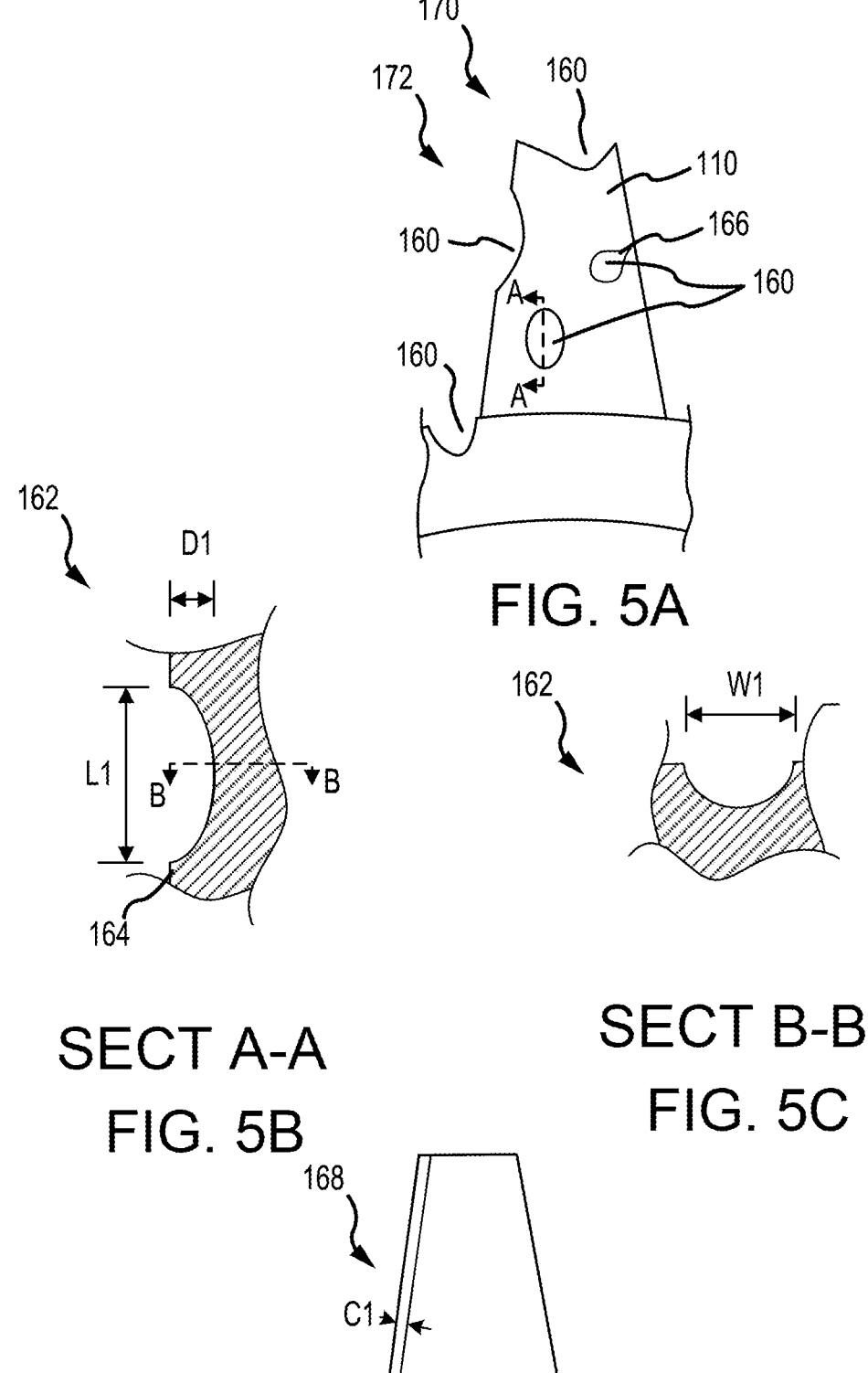
FIG. 5A illustrates a portion of a repaired bladed rotor, in accordance with various embodiments.
FIG. 5B illustrates a repair blend profile, in accordance with various embodiments.
FIG. 5C illustrates a repair blend profile, in accordance with various embodiments.
FIG. 5D illustrates a repair blend profile, in accordance with various embodiments.

Once the blending mask 150 has been applied, material is removed using the generally manual material removal operation resulting in a repaired blade portion 172 of a repaired IBR 170 including a plurality of repair blend profiles 160, as is illustrated in FIG. 5A.

In various embodiments, each repair blend profile in the plurality of repair blend profiles 160 is based, at least partially, on a defect shape of a respective defect 140 from FIG. 3. In various embodiments, as described further herein, the systems and methods disclosed herein facilitate a greater number of potential blend options for a respective defect 140 from FIG. 3. For example, if a repair blend was too large and fell out of experience based functional criteria, an IBR 100 could be scrapped as opposed to being blended as described further herein and placed back into service.

In various embodiments, explicit instructions are derived from the automated process and supplied to a computer numerical controlled (CNC) machine. In this instance, blending masks may not be utilized as the manual blending operation is replaced by the machine automated process. Blends of IBR 100 can be by either manual or automated processes, or a combination of those processes. In wholly automated processes, the creation of the mask can be omitted.

In addition to removing the locations of the defects 140, it is beneficial to remove material deeper than the observed damage in order to ensure that all damage is removed and to prevent the propagation of new damage. In various embodiments, a blend aspect ratio (e.g., a length–depth ratio) is maintained in order to ensure that there is a smooth and gradual transition from the edge of the undamaged blade 103 to the bottom of the deepest portion of the blend, and then back to the undamaged surface of the blade 103 on the other side of the blend.

Although FIGS. 2-5A illustrated blending solutions applied to the IBR 100 in locations including the rotor disk 102, the blade 103, an edge 121 (e.g., a leading edge or a trailing edge), a tip 122, an airfoil surface 123 (e.g., a pressure surface or a suction surface), it can be appreciated that a repair of each location shown on the same blade 103 is unlikely. The various locations are shown for illustrative purposes of potential repair locations, in accordance with various embodiments. The illustrated defects 140, blending masks 150, and repair blend profiles 160 on the IBR 100 are exemplary of the limited applications and not of every repair made according to the description herein.

In order to assist with the blending process and, facilitate efficient determination of acceptability of an IBR 100 to return into service, a semi-automated (or fully automated)

system is utilized to inspect, analyze, and repair an IBR 100, in accordance with various embodiments.

In various embodiments, repair blend profiles 160 can include a scallop shape, a tear drop shape, a material reduction along an edge (i.e., chord reduction), or the like. The present disclosure is not limited in this regard.

For example, with reference now to FIGS. 5B, and 5C, a repair blend profile 162 is illustrated. In various embodiments, the repair blend profile comprises a convex shape and defines a recess in an outer surface of the repaired IBR 170 (e.g., a pressure surface, a suction surface, a rotor disk surface, or the like). In various embodiments, the repair blend profile is recessed from the outer surface 164 of the repaired IBR 170. In various embodiments, the repair blend profile 162 comprises a depth D1, a length L1 and a width W1. In various embodiments, the repair blend has a length L1 that is greater than a width W1. However, the present disclosure is not limited in this regard. For example, the length L1 can be equal to the width W1, in accordance with various embodiments. An aspect ratio of a blend profile, as referred to herein, refers to a length L1 dived by a width W1 of the repair blend profile. In various embodiments, the repair blend profile is substantially symmetric about a plane defined by a first point, a second point and a third point. The first point can be a max depth location. The second point and the third point can define a line that measures a maximum length (e.g., length L1) of the repair blend, in various embodiments. In various embodiments, the second point and the third point can define a line that measures a width in a perpendicular direction from the length L1. The present disclosure is not limited in this regard. As referred to herein, "substantially symmetrical" is a first profile on a first side of the plane that is within a profile of between 0.01 inches (0.025 cm) and 0.25 inches (0.64 cm) from the second profile on the second side of the plane, or between 0.01 inches (0.025 cm) and 0.125 inches (0.32 cm), or between 0.01 inches (0.25 cm) and 0.0625 inches (0.16 cm).

Although described herein as being substantially symmetrical, the present disclosure is not limited in this regard. For example, the repair blend profile can comprise a tear drop shape (e.g., repair blend profile 166 from FIG. 5B), a chord reduction (i.e., shorting a chord length by a chord reduction length C1 along a span of the blade 103 of the repaired IBR 170 as shown in FIG. 5D), or the like. The present disclosure is not limited in this regard.

Figure 6A:
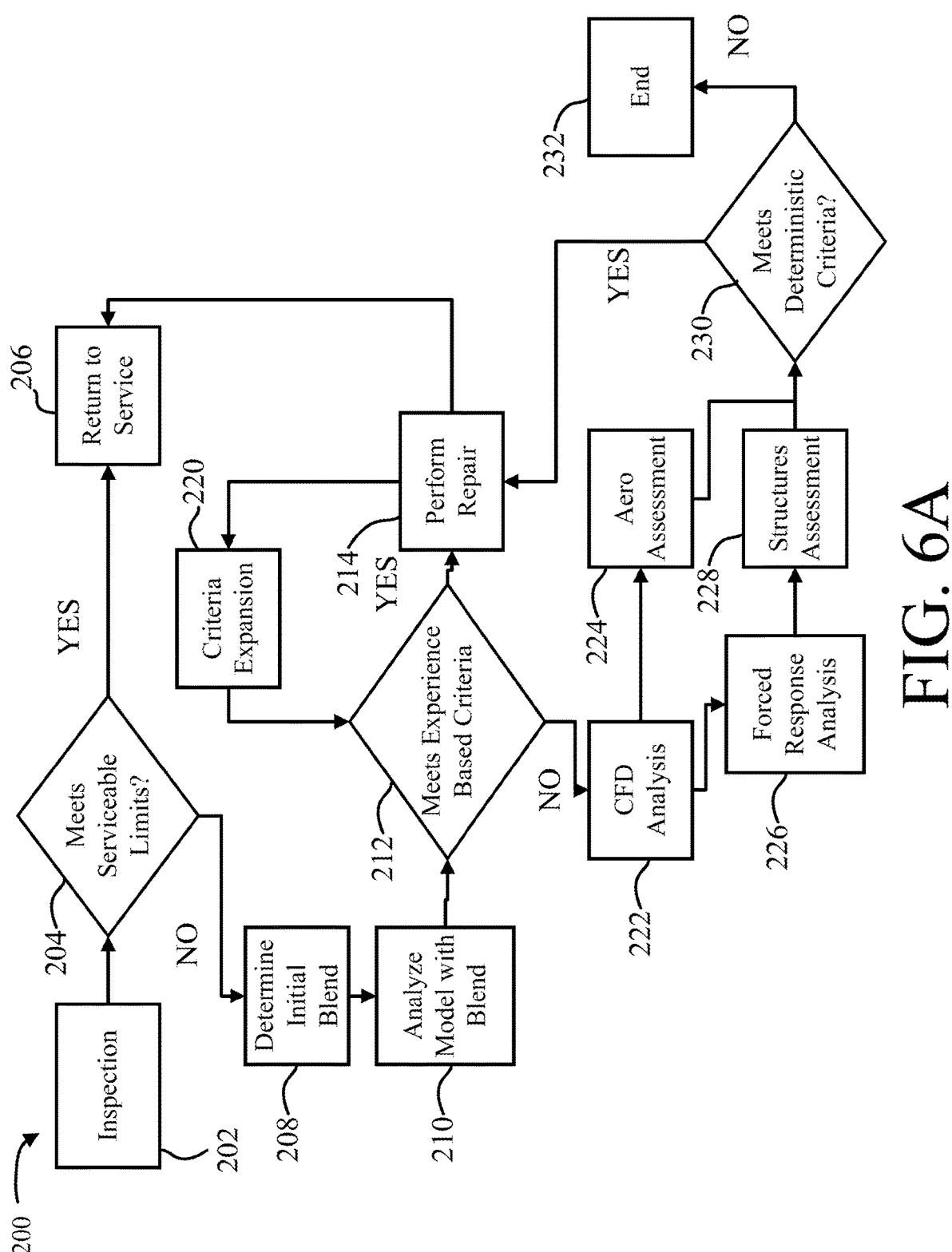
FIG. 6A illustrates an inspection, analysis, and repair process for a bladed rotor, in accordance with various embodiments.

Referring now to FIG. 6A, a process 200 for repairing an IBR 100 from FIG. 1B from a compressor section (e.g., compressor section 24) of a gas turbine engine 20 from FIG. 1A is illustrated, in accordance with various embodiments. For example, after a predetermined number of flight cycles, or due to an unscheduled maintenance, the process 200 may be performed for one or more of IBR 100 in the compressor section 24 of the gas turbine engine 20. In various embodiments, process 200 may be performed for IBRs 100 from several gas turbine engines (e.g., in accordance with gas turbine engine 20), which may facilitate various potential repair options as described further herein.

The process 200 comprises inspection of a bladed rotor (e.g., an IBR) (step 202). In various embodiments, the dimensional inspection can be performed by an inspection system (e.g., inspection system 285 shown in FIGS. 7 and 8 further herein) or visually (e.g., via an inspector or the like). The present disclosure is not limited in this regard. In various embodiments, the dimensional inspection can be facilitated by use of an optical scanner (e.g., structured light scanners, such as white light scanners, structured blue light scanners, or the like) and/or a coordinate-measuring machine. The present disclosure is not limited in this regard. Thus, step 202 can further comprise scanning the IBR 100 with a scanner (e.g., structured light scanners, such as white light scanners, structured blue light scanners, and/or, a coordinate-measuring machine). In response to scanning the IBR 100, a digital representation of the IBR 100 (e.g., a point cloud, a surface model, or the like) from FIGS. 2-3 is generated. In this regard, the defects 140 of the IBR 100 can be graphically depicted and analyzed, as described further herein. In various embodiments, is either converted to, or is generated as, a three-dimensional model (e.g., a Computer Aided Design (CAD) model or Finite Element Model (FEM)). The three-dimensional model may be utilized for analyzing the IBR 100 in process 250 of process 200.

In various embodiments, the three-dimensional model generated from step 202 includes a digital representation each defect of the IBR 100 from FIGS. 2-3. In this regard, the process 200 further comprises determining whether the IBR 100 meets serviceable limits (step 204). In various embodiments, "serviceable limits" as described herein refers to objective parameter limits of defects (e.g., wear, damage, etc.) for the IBR 100. For example, an objective parameter limit can be a threshold defect depth, a threshold defect length, a threshold defect aspect ratio, a threshold number of defects per blade, a threshold number of defects per IBR 100, any combination of the objective parameter limits disclosed herein, or the like. The present disclosure is not limited in this regard, and one skilled in the art may recognize various objective parameters for quantifying whether an IBR meets serviceable limits and be within the scope of this disclosure. In various embodiments, step 204 can be performed by an inspection system 285 or an analysis system 600 as described further herein. The present disclosure is not limited in this regard. If step 204 is performed by the inspection system 285, a determination on whether the IBR 100 is serviceable can be made rather quickly, on-site at an overhaul facility, in various embodiments. If step 204 is performed by the analysis system 600, a quick turnaround could still be achieved via cloud computing, or the like, as described further herein, in accordance with various embodiments. In this regard, step 204 can potentially be determined more quickly due to greater potential computing power in a cloud based environment.

In various embodiments, in response to the IBR 100 meeting serviceable limits in step 204, the process further comprises returning the IBR 100 to service (step 206). In this regard, the IBR 100 can be re-installed on a gas turbine engine 20 from FIG. 1A. In various embodiments, the IBR 100 is installed on the same gas turbine engine 20 from which it was removed from. However, the present disclosure is not limited in this regard, and the IBR 100 could be installed on a different gas turbine engine 20 from which it was removed and still be within the scope of this disclosure.

In various embodiments, in response to the IBR 100 not meeting serviceable limits in step 204, an initial blend profile (e.g., repair blend profile 162, repair blend profile, 166, or repair blend profile 168 from FIGS. 5A-D) is determined and/or generated for each defect 140 of the IBR 100. In various embodiments, initial blend profiles can only be determined/generated for defects 140 that do not meet the objective defect parameter(s) from step 204. In various embodiments, a blend profile is generated for all defects 140 of the IBR 100. The present disclosure is not limited in this regard.

In various embodiments, the blend profile is based on consistent parameters and is generated automatically via the process 200. For example, each blend may be modeled in step 208 to remove a predetermined amount of additional material and to generate a smooth blend across the entirety of the defect. In various embodiments, the model generated in step 208 is a three-dimensional model (e.g., a Computer Aided Design (CAD) model or Finite Element Model (FEM)). In various embodiments, the model generated in step 208 can be imported into various third party software programs, such as ANSYS, ANSYS Workbench, ANSYS Computational Fluid Dynamics (CFD), or the like. In this regard, structural and aerodynamic simulations can be performed in step 210 for a digital representation of a repaired IBR 170 (a "repaired IBR digital model" as described further herein). The repaired IBR digital model can be a CAD model or an FEM model based on a specific analytical simulation being performed, in accordance with various embodiments. A repaired IBR as described herein refers to a repaired IBR 170 at least one repaired blade portion 172 having at least one repair blend profile 160 (e.g., repair blend profile 162, 166, or 168 from FIGS. 5A-D). The digital representation is based on the inspected IBR that was inspected in step 202 and modeled with initial blend profiles for a plurality of defects 140 in the IBR 100, in accordance with various embodiments.

In various embodiments, the process 200 further comprises analyzing the repaired IBR digital model (step 210). In various embodiments, the analysis in step 210 includes various simulations. For example, the various simulations can include simulations to evaluate a modal assurance criteria (MAC), a resonant frequency, an aerodynamic efficiency, a stall margin, damage tolerance, dynamic stress from vibration, or the like. In various embodiments, damage tolerance may be an optional criteria to analyze (e.g., if the bladed rotor is not an IBR but a bladed rotor having a distinct rotor disk and distinct blades). The simulations can be via various simulation software platforms described previously herein.

In various embodiments, analyzing the repaired IBR digital model can include optimizing the blend profile shape based on various parameters. For example, step 210 can include iterating the blend profile shape based on the various simulations and results of the various simulations. In various embodiments, the blend profile shape is only analyzed for the initial blend profile generated in step 208. However, the present disclosure is not limited in this regard.

In various embodiment, step 210 further comprises comparing the simulation results to experience based criteria.

For example, if an IBR 100 is known, based on prior test data during development, to have a resonant frequency that varies by a threshold percentage (e.g., 3%, 5%, 8%, etc.) from a nominal frequency, and if a threshold number of the IBR 100 have been in service for a threshold number of cycles (e.g., 2,000 flight cycles, 10,000 flight cycles, or the like), then an experience based criteria for the resonant frequency can be created. For example, if a modal analysis determines a resonant frequency for the repaired IBR digital model is within the threshold percentage, the experience based criteria for resonant frequency would be considered met because the experimental data from development that indicates that the IBR 100 varies in resonant frequency by the threshold percentage without issue has been validated by experience by the threshold number of the IBR 100 having been in service for the threshold number of cycles. Stated another way, the resonant frequency being acceptable within a threshold range of frequencies has been validated by experience in service.

Similarly, if an IBR 100 is known, based on prior test data during development, to have a MAC that varies by a threshold percentage (e.g., 3%, 5%, 8%, etc.) from a nominal MAC, and if the threshold number of the IBR 100 have each been in service for the threshold number of cycles, then an experience based-criteria for the MAC can be created. For example, if the simulation to determine the MAC for the for repaired IBR digital model is less than the nominal MAC plus the threshold percentage, the MAC can be determined acceptable as being validated by experience in a similar manner as the resonant frequency example provided above.

If an IBR 100 is known, based on prior test data during development, to have an aerodynamic efficiency that varies by a threshold percentage (e.g., 3%, 5%, 8%, etc.) from a nominal aerodynamic efficiency, and if the threshold number of the IBR 100 have each been in service for the threshold number of cycles, then an experience based-criteria for the aerodynamic efficiency can be created. For example, if the simulation for the repaired IBR digital model has a greater aerodynamic efficiency than the nominal aerodynamic efficiency less the threshold percentage, than the aerodynamic efficiency being acceptable has been validated by experience in the field.

In various embodiments, the acceptable experience based criteria for aerodynamic efficiency can be based on being greater than the aerodynamic efficiency determined from testing and validated by experience in service, as opposed to being based on nominal less the threshold percentage. In this regard, additional margin of error would be provided for the repaired IBR (i.e., a greater safety factor), in accordance with various embodiments. The present disclosure is not limited in this regard.

If an IBR 100 is known, based on prior test data during development, to have a stall margin that varies by a threshold percentage (e.g., 3%, 5%, 8%, etc.) from a nominal stall margin, and if the threshold number of the IBR 100 have each been in service for the threshold number of cycles, then an experience based-criteria for the stall margin can be created. For example, if the simulation to determine stall margin for the repaired IBR digital model has a greater stall margin than the nominal aerodynamic stall margin less the threshold percentage, than the stall margin being acceptable has been validated by experience in the field.

In various embodiments, the acceptable experience based criteria for stall margin can be based on being greater than the nominal stall margin determined from testing and validated by experience in service, as opposed to being based on nominal less the threshold percentage. In this regard, additional margin of error would be provided for the repaired IBR (i.e., a greater safety factor), in accordance with various embodiments. The present disclosure is not limited in this regard.

If an IBR 100 is known, based on prior test data during development, to have a damage tolerance (e.g., a threshold crack size that results in growth during operation) that varies by a threshold percentage (e.g., 3%, 5%, 8%, etc.) from a nominal damage tolerance, and if the threshold number of the IBR 100 have each been in service for the threshold number of cycles, then an experience based-criteria for the damage tolerance can be created. For example, if the simulation to determine damage tolerance for the repaired IBR digital model has a lower threshold crack growth size than the nominal threshold crack growth size plus the threshold percentage, than the damage tolerance being acceptable has been validated by experience in the field.

Thus, after analyzing the repaired IBR digital model in step 210, the process 200 further comprises determining whether the experienced based criteria is met for each experience-based criteria parameter (step 212). In various embodiments, the experience based criteria described herein is exemplary, and not all experience based parameters may be analyzed for a respective repaired IBR.

In various embodiments, in response to the simulation data from the various simulations showing that the experience based criteria is met, the process further comprises performing the repair on the IBR 100 that was inspected in step 202 with a repair process that generates the initial blend profiles (e.g., repair blend profile 162, 166, or 168 from FIGS. 5A-D, or the like) for each defect (e.g., defects 140 from FIG. 3) (step 214). In various embodiments, the repair process may be in accordance with the repair processes described with respect to FIGS. 2-5. In various embodiments, the repair process is performed by a repair system as described further herein. The present disclosure is not limited in this regard.

Figure 6B:
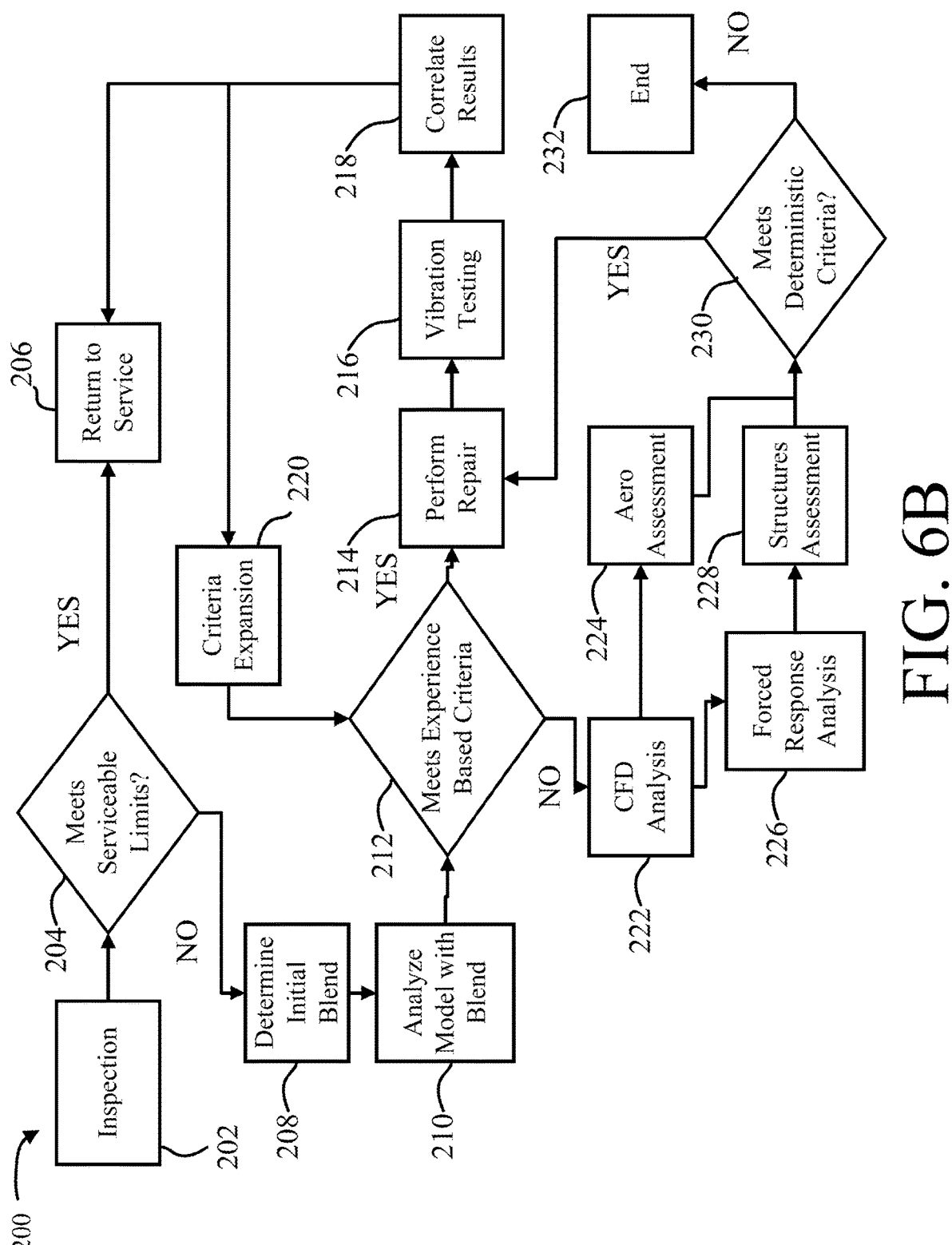
FIG. 6B illustrates an inspection, analysis, and repair process for a bladed rotor, in accordance with various embodiments.

In various embodiments, with brief reference to FIG. 6B, the process 200 can further comprises vibration testing (step 216) and correlating the results from the simulations in step 210 (step 218). Although illustrated as including vibration testing and correlation of results in steps 214, 216, the process 200 may disregard these steps and move directly to returning the repaired IBR to service in step 206, as shown in FIG. 6A. The present disclosure is not limited in this regard. In various embodiments, the vibration testing step 216 can be a bench test (i.e., on a machine configured to induce a response at a specific resonant frequency) or an on-engine test. The present disclosure is not limited in this regard. In various embodiments, results may be correlated based on an analysis of strain gauge data.

Referring back to FIG. 6A, the process 200 further comprises expansion of experience based criteria in step 220. In this regard, based on additional testing after performing the repair, threshold values can be updated for the experience based criteria to provide greater fidelity and generate faster dispositions for future repair processes, in accordance with various embodiments.

In various embodiments, in response to the experience based criteria not being met, additional analysis of the repaired IBR digital model can be performed in steps 222, 224, 226, and 228. In this regard, aerodynamic models with greater fidelity can be generated for the CFD analysis in step 222, and finite element models with greater fidelity (e.g., greater number of nodes or the like) can be generated for the forced response analysis and the structures assessment in step 228.

In various embodiments, the analysis performed in steps 222, 224, 226, and 228 are performed at a higher fidelity because they will be analyzed as if the repaired IBR is a completely new design. In this regard, the aerodynamic assessment in step 224 and the structures assessment in step 228 can be compared to deterministic criteria (i.e., design criteria or the like). For example, although a resonant frequency of the IBR may not be at a resonant frequency within the experience based range, the resonant frequency may result in a dynamic stress in stress limiting locations that is less than the dynamic stress induced by the IBR 100, which would result in an IBR 100 that is more robust with regards to dynamic stress relative to an ideal IBR (e.g., a newly manufactured IBR 100). In various embodiments, even if a resonant frequency that is not with the experience based range of resonant frequencies results in a greater dynamic stress in limiting locations, the dynamic stress can still be less than a threshold dynamic stress based on a Goodman diagram threshold. In various embodiments, the threshold dynamic stress can correspond to a maximum alternating stress for the material for a mean stress at the location of the dynamic stress. Thus, even if the resonant frequency is outside a range of resonant frequencies that are known to be acceptable based on experience, and the resonant frequency generates a greater dynamic stress relative to the ideal IBR 100, the repaired IBR 170 can still be acceptable based on the deterministic criteria, in accordance with various embodiments. In this regard, a greater number of acceptable repairs for IBRs can be generated and a greater fidelity can be created for the experience based criteria as the process 200 is repeated for numerous IBRs 100 over time.

In various embodiments, in response to the deterministic criteria being met in steps 230, subsequent steps 214, 216, 218, 220, and 206 mentioned previously herein can be repeated. In various embodiments, the criteria expansion of step 220 after going through steps 222, 224, 226, 228, 230 can greatly widen acceptable experience based criteria as more data of various repair shapes and sized can be gathered over time.

In various embodiments, in response to the deterministic criteria not being met, the process 200 ends at step 232. In various embodiments, in response to the process ending at step 232, the repaired IBR digital model can be stored in a database for later analysis, and the IBR 100 can be placed in storage. In this regard, the repaired IBR digital model could be utilized in later higher fidelity simulations analyzing the IBRs at a system level to determine if the IBR would be acceptable at a system level. Thus, the process 200 can further accommodate system level analysis of IBRs that don't meet the deterministic criteria in step 230, in accordance with various embodiments.

Figure 6C:
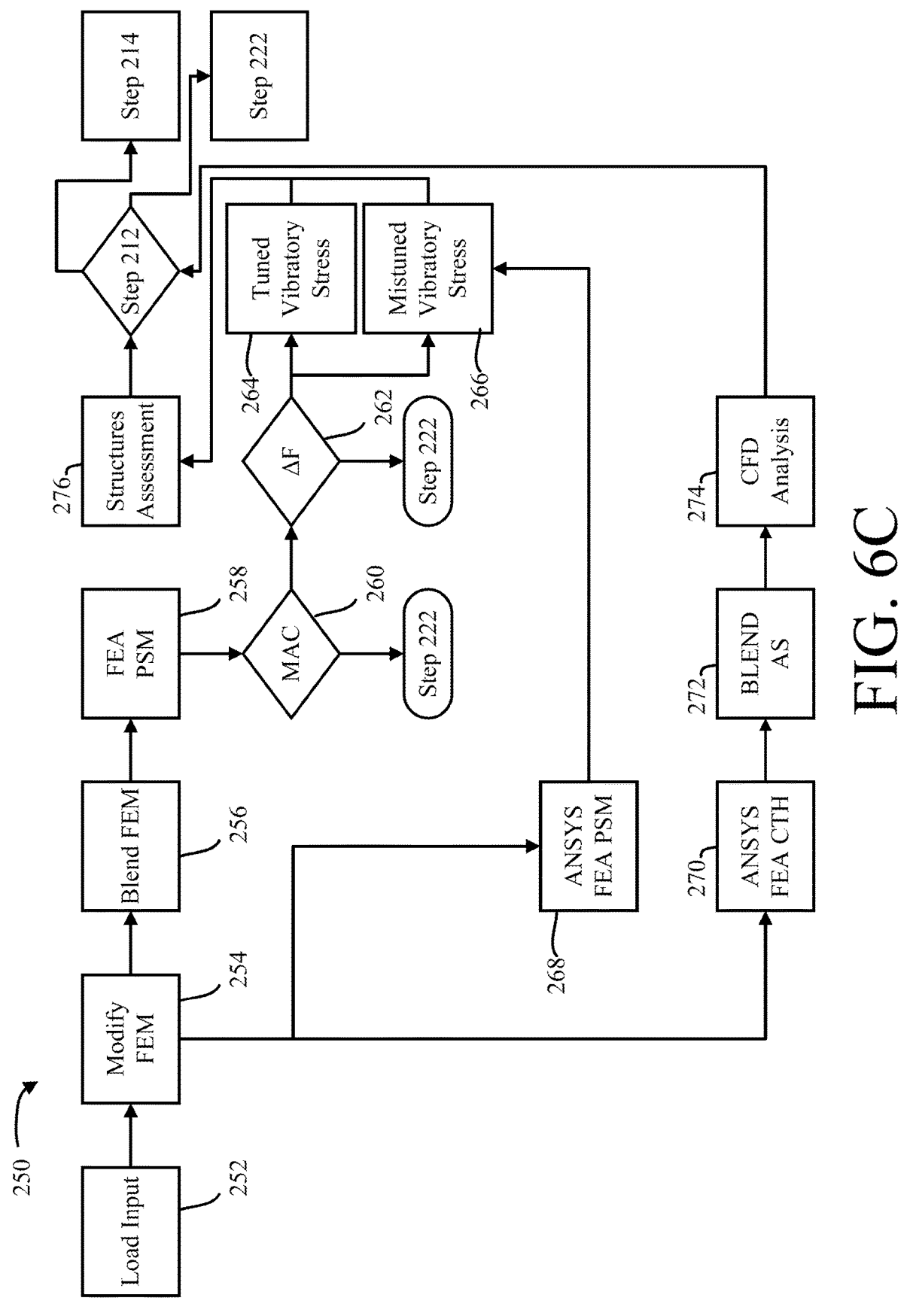
FIG. 6C illustrates an analysis during the inspection, analysis, and repair process for a bladed rotor from FIGS. 6A-B, in accordance with various embodiments.

Referring now to FIG. 6C, a detailed view of steps 210, 212 from process 200 are illustrated in accordance with various embodiments as a sub-process (e.g., process 200). Although illustrated and described herein as a subprocess of the process 200, present disclosure is not limited in this regard. For example, the process 250 can be utilized independently from the process 200 from FIG. 6A. Similarly, the process 250 is not meant to limit variations to the process 200 in steps 208, 210, 212 as described previously herein.

In various embodiments, the process 250 comprises receiving load inputs for the various simulations described previously herein with respect to the analyzing step 210 from process 200. For example, the load inputs may include blade definition (e.g., determined from the inspection step 202 from process 200), blend definition (i.e., determined from step 208 from process 200), experience based criteria s described previously herein, high cycle fatigue conditions (i.e., boundary conditions for modal analysis), high cycle fatigue capability (e.g., material data described further herein), boundary conditions for fine particle modeling (FPM), a baseline FEM (e.g., a nominal finite element model of an ideal IBR 100), section files defining blade definition (i.e., two-dimensional cross-sectional contours of a blade determined from a digital point cloud received form the inspection step 202 from process 200), section files to FEM alignment parameters, aerodynamic analysis boundary conditions, structural analysis boundary conditions, etc. The present disclosure is not limited in this regard. In various embodiments, once the load inputs 252 are uploaded to an analysis system, the process 250 can run upon receiving data from the inspection step 202 as described further herein.

The process 250 further comprises modifying an ideal finite element model (FEM) corresponding to an ideal IBR based on data received from the inspection step (e.g., based on the digital point cloud). In this regard, the ideal finite element model can be modified based on measured geometry of a respective blade 103 in step 202 of process 200, in accordance with various embodiments.

The process 250 further comprises blending the finite element model based on determining various defect locations (e.g., locations of defects 140 of the IBR 100 from FIG. 2), and modeling the initial blend determined in step 208 of process 200 (step 256. In this regard, the repair blend profile 160 can be modeled (e.g., a finite element model) for each respective defect based on a size of the defect 140 (e.g., a depth D1, a length L1, and a width W1 of the defect 140 or the like) and a location of the defect 140 from FIG. 2.

In various embodiments, the process 250 further comprises performing pre-stressed modal analysis with pre and post processing operations of the blended finite element model from step 256 (step 258). In this regard, steady state analysis, modal analysis, and/or any additional post-processing for the finite element analysis (FEA) and/or pre-stressed modal (PSM) can be performed prior to mode shape analysis and resonant frequency comparisons.

In various embodiments, the process 250 further comprises assessing mode shape shift relative to the ideal IBR (step 260). The mode shift can be assessed using mode match results. Magnitude of a respective mode shape can be compared to experience based criteria for MAC as described previously herein. In various embodiments, if the MAC does not meet the experience based criteria in step 260, the process 250 reverts to step 222 of process 200. In response to the experience criteria for MAC being met, the process 250 assesses frequency shift relative to experience based data as described previously herein (i.e., as described with respect to step 208 of process 200 above) (step 262). In response to the experience based criteria for frequency shift not being met, the process 250 reverts to step 222 of process 200 as described previously herein. In response to the experience based criteria for frequency shift being met, the process 250 proceeds to a tuned vibratory stress analysis in step 264 and a mistuned vibratory stress analysis in step 266.

In various embodiments, the tuned vibratory stress analysis is configured to account for any change in mode shape caused by geometric changes from the blend and specific geometry of adjacent blades to a blade being blended as described previously herein. In various embodiments, a tuned stress factor is calculated and applied to the vibratory stress prior to high cycle fatigue analysis. In various embodiments, the tuned vibratory stress analysis performs the comparison by pulling in the FEA and PSM analysis of the baseline from step 268 (i.e., an ideal IBR), in accordance with various embodiments.

In various embodiments, the mistuned vibratory stress analysis in step 266 is configured to account for frequency distribution for all the blades of the inspected IBR 100 from step 202 of process 200. In this regard, a mistuned stress correction factor can be calculated to adjust for mistuning effects prior to performing a high cycle fatigue assessment in step 276 as described further herein.

After the tuned vibratory stress analysis (step 264) and the mistuned vibratory stress analysis (step 266) are performed, a structures assessment, including the high cycle fatigue (HCF) assessment of the IBR 100 with potential repair blend profiles 160, can be analyzed (step 276). In various embodiments, the structures assessment performed in step 276 can also include a crack growth assessment (i.e., damage tolerance assessment) to determine a maximum flaw size that the IBR 100 with the potential repair blend profiles 160 can tolerate without growth.

In various embodiments, steps 264, 266, 276 are not limited to vibratory stress analysis, mistuning stress analysis, HCF assessment, or crack growth assessment as described previously herein. For example, flutter can also be analyzed by various simulations and be within the scope of this disclosure. Similarly, the analysis can be strictly physics based and/or scaled based on test data, in accordance with various embodiments. In various embodiments, structural simulations for unsteady CFD can also be performed an analyzed and be within the scope of this disclosure.

In various embodiments, the process 250 can extend directly from step 262 to step 212. For example, the structural simulations in steps 264, 266, and the structural assessment in step 276 can be optional, in accordance with various embodiments. For example, if the initial blend definition (e.g., from step 256 or from step 208 in process 200) is below a threshold blend (e.g., a threshold depth, a threshold aspect ratio, etc.), then steps 264, 266, 276 can be skipped, in accordance with various embodiments.

In various embodiments, while the structures analysis is being performed in steps 254, 256, 258, 260, 262, 264, 266, 268, a computational fluid dynamics (CFD) analysis can be performed simultaneously in steps 270, 272, 274. For example, in step 270 a cold to hot analysis of the IBR 10 can be performed prior to performing an aerodynamic analysis. A cold to hot analysis includes the change in the shape of IBR 100 from the conditions the airfoil was inspected at to the engine operating conditions of interest in the aerodynamic analysis based on structural boundary conditions.

In various embodiments, the aerodynamic model can be modified in step 272 to replicate the potential repair blend profile 160 and be as similar as possible to the potential repair blend profile model in step 256 (step 272). In various embodiments, the aerodynamic model with the potential repair blend profile modeled and the cold to hot analysis serving as inputs can be analyzed via computational fluid dynamics (e.g., via a fine particle model (FPM)) using aerodynamic boundary conditions as described previously herein.

In various embodiments, results from the HCF assessment and the crack growth assessment in step 276, and results from the CFD analysis from step 274 can be compared to experience based criteria in step 212 of process 200 as described previously herein.

Thus, if the HCF assessment and the crack growth assessment meet the experience based criteria in step 212, the process proceeds to step 214 of process 200. If the results from the HCF assessment and the crack growth assessment do not meet the experience based criteria in step 212, then the process proceeds to step 222 in process 200 as described previously herein.

Figure 6D:
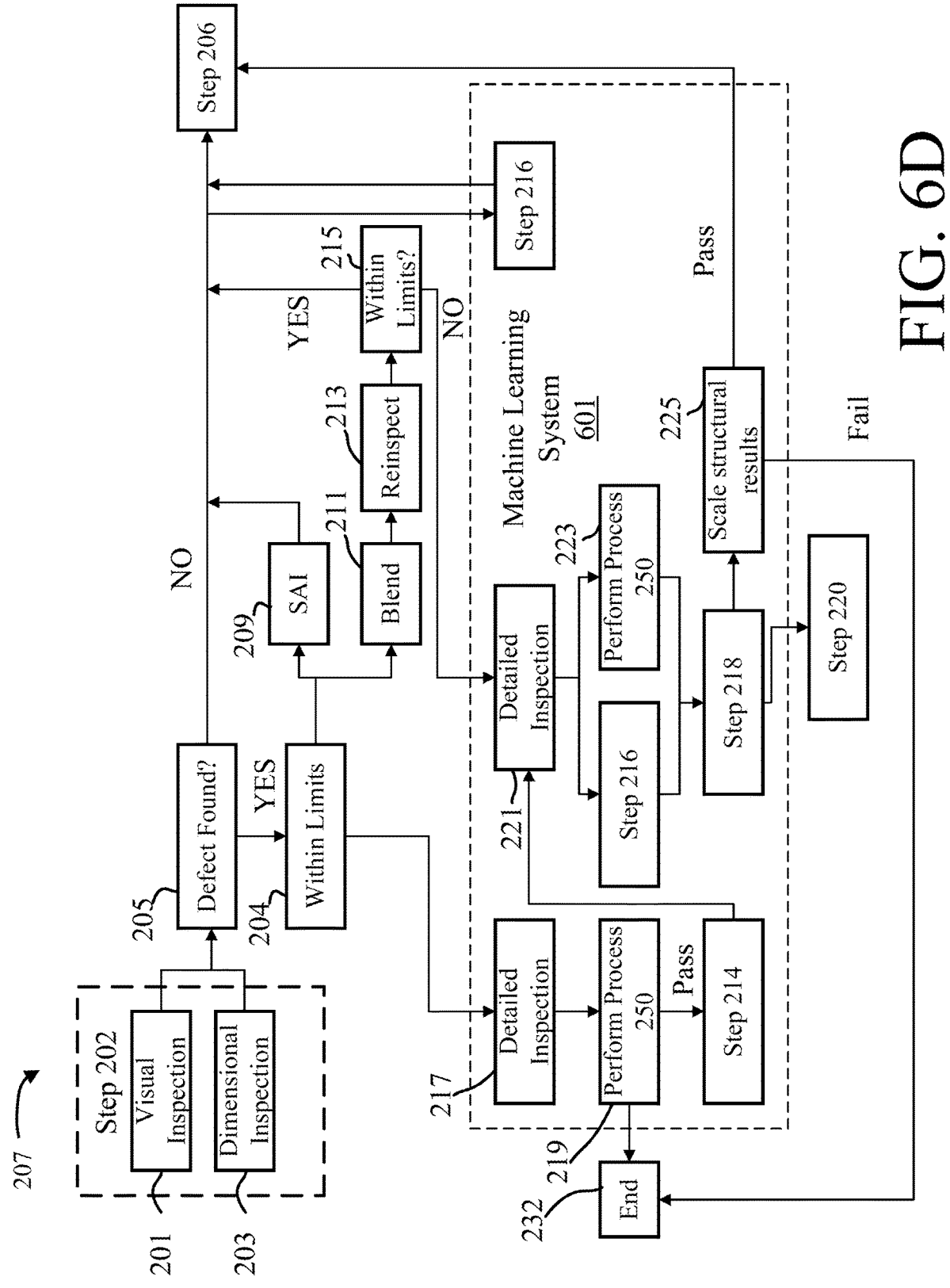
FIG. 6D illustrates an inspection, analysis, and repair process for a bladed rotor, in accordance with various embodiments.

Referring now to FIG. 6D, a process 207 is illustrated, in accordance with various embodiments. Although illustrated as having overlapping steps with process 200 from FIG. 6A, the process 207 can be performed independent of process 200, in accordance with various embodiments. The present disclosure is not limited in this regard. In various embodiments, the inspection in step 202 can further comprise a visual inspection (step 201) and a dimensional inspection (step 203) (e.g., via an inspection system 285 as described further herein). In various embodiments, the visual inspection of step 201 can inform the dimensional inspection of step 203. For example, areas of interest (e.g., potential defects) can be identified from the visual inspection, and the dimensional inspection in step 203 can be limited to those areas of interest for process 200, in accordance with various embodiments.

In various embodiments, after the inspection step 202, if no defects are found in step 205, the bladed rotor 100 can be returned to service in step 206 as described previously herein. In response to defects being found in step 205, the defects can be analyzed to determine if the defects are within serviceable limits (step 204), as described previously herein.

In various embodiments, based on a defect size and/or a defect shape, it can be determined that the defect of the bladed rotor is serviceable as is (step 209), or an experience based blend can be performed in step 211. For example, defects below a threshold size can be understood based on experience to be serviceable as is or capable of receiving an experience based blend repair (e.g., a blend having a depth that is less than a depth threshold and a shape that corresponds to an experience based shape). An "experience based shape" as referred to herein is a blend shape that corresponds to a size and configuration that has been performed on a bladed rotor above a threshold number of times (e.g., 100, 1,000, or the like).

In various embodiments, after the experience based blend is performed on the defect in step 211, the bladed rotor can be re-inspected (step 213). In various embodiments, the re-inspection can be in accordance with the inspection step 202.

In various embodiments, the process 207 further comprises determining whether the repaired bladed rotor is within serviceable limits in step 215. For example, for the experience based blend, the blend can have predefined parameters (e.g., a depth within a specified tolerance, an aspect ratio within a specified tolerance, a radius of curvature within a specified tolerance, etc.). In this regard, the experience based blend can be compared to the limits of an ideal experience based blend to determine if the blend meets the blend definition associated with the ideal experience based blend.

In various embodiments, if the experience based blend is within limits in step 215, the bladed rotor can return to service in step 206 as described previously herein. If the experience based blend is not within limits, the process 200 can process to step 217 as described further herein.

In various embodiments, the process 200 can utilize a machine learning system 601 (e.g., a deep neural network (DNN), an artificial neural network (ANN), or the like) further expand criteria in step 220 as described previously herein. In this regard, the process steps in the machine learning system 601 can be fully automated, resulting in a robust, self-learning, inspection, analysis, and repair system as described further herein.

In various embodiments, if the defect is not within serviceable limits in step 204, the process proceeds to step 217. In various embodiments, step 217 comprises a detailed inspection of the defect. In various embodiments, the detailed inspection is performed via inspection system 285 as described further herein. In this regard, data corresponding to a size or shape of the defect (or the repair blend profile) can be to perform process 250 in step 219, in accordance with various embodiments. After having the detailed inspection performed, the bladed rotor can be analyzed in accordance with process 250 from FIG. 6C, in accordance with various embodiments.

In various embodiments, after performing process 250 in step 219, the process proceeds to step 214 in response to passing the process 250. In this regard, a blend corresponding to a repair blend profile from the process 250 can be performed. After the defect found in step 205 is repaired in accordance with the repair blend profile determined from the process 250, a detailed inspection of the repair blend profile can be performed in step 221. In various embodiments, if the experience based blend from step 211 is determined not to be within experience based limits in step 215, the bladed rotor 100 with the experience based blend can proceed to step 221.

After step 221, the process 250 can be performed in step 223 for the bladed rotor with the blend repair, in accordance with various embodiments. However, the present disclosure is not limited in this regard, and the process 250 from step 219 can be relied on, in accordance with various embodiments.

In various embodiments, vibrational testing of the repaired IBR can be performed in step 216 in parallel with the process 250 from step 223. In this regard, the results can be correlated in step 218 (i.e., either to the results from process 250 in step 219 or the process 250 in step 223). The present disclosure is not limited in this regard.

In various embodiments, in step 225 the structural results can be scaled to operating conditions based on engine test data as described further herein. In response to scaling the results from step 218, experience based structural criteria can be analyzed (e.g., in accordance with step 212 from process 200). In response to the experience based structural criteria being met, the bladed rotor can be returned to service in step 206, in accordance with various embodiments. In various embodiments, if the structural criteria are not met, the process can end at step 232 (e.g., to be held for future repair/use or to be scrapped).

In various embodiments, prior to step 206 and coming from step 205, 209, or 215, a vibration test in accordance with step 216 can optionally be performed to provide additional data for the machine learning system 601, in accordance with various embodiments. In this regard, the machine learning system 601 can be provided with additional data to use in future determinations, in accordance with various embodiments.

Figure 6E:
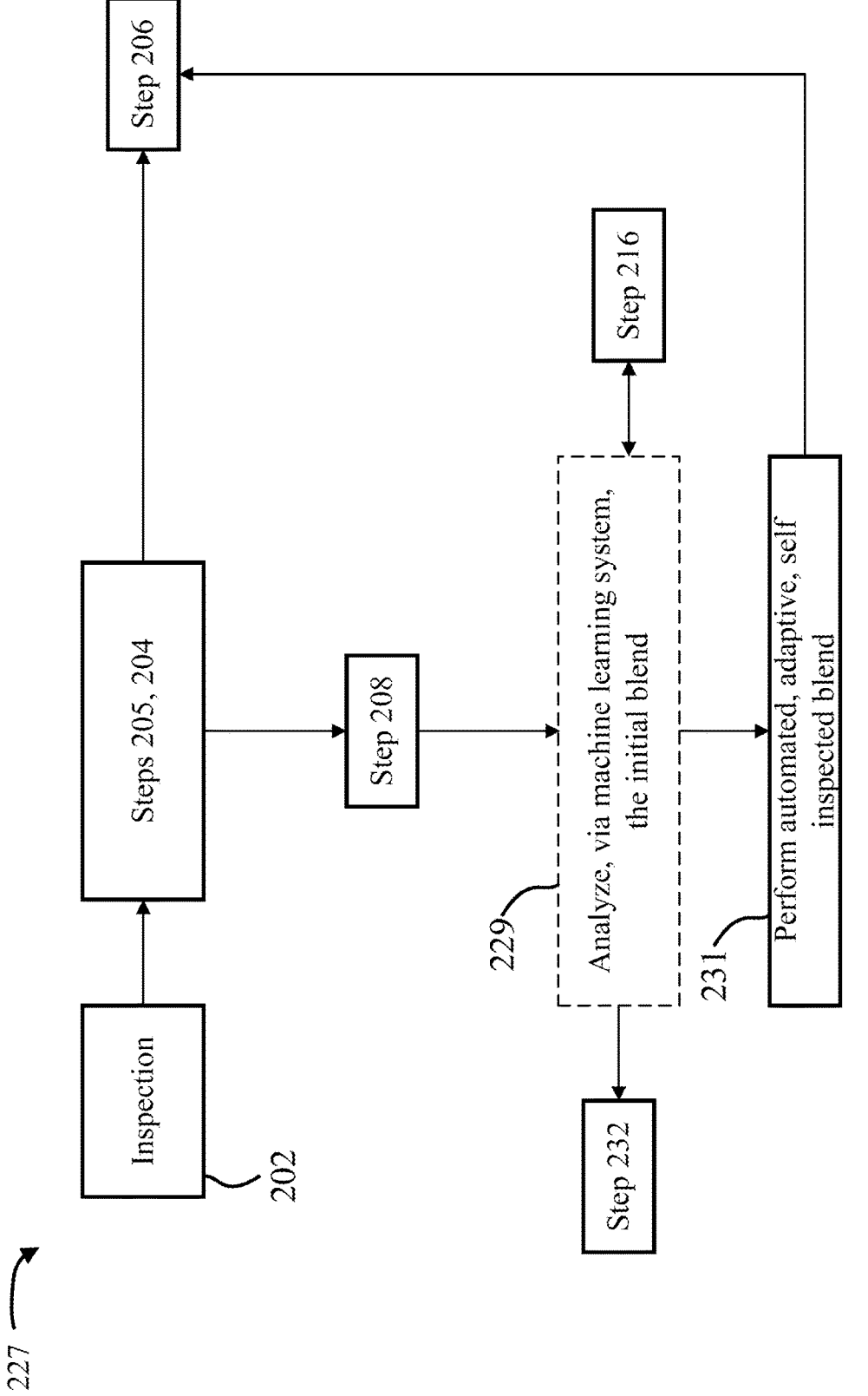
FIG. 6E illustrates an inspection, analysis, and repair process for a bladed rotor, in accordance with various embodiments.

Referring now to FIG. 6E, a process 227 for inspecting, analyzing, and repairing a bladed rotor 100 is illustrated, in accordance with various embodiments. In various embodiments, the process 227 comprises inspection of the bladed rotor 100 (step 202) and performing steps 205 and 204 from process 200 in FIG. 6C. In this regard, the defect has been determined not to be within serviceable limits and proceeds to step 208 from process 200 of FIG. 6A. In step 208, an initial blend repair profile is created and sent to the machine learning system 601 from FIG. 6C. In step 229, the machine learning system can analyze the initial blend from step 208 and determine whether the initial blend meets the expanded experience based criteria from the learning from the process of FIG. 6C, in accordance with various embodiments.

In various embodiments, vibration testing can optionally be performed in step 216 after the analysis in step 229 to further correlate data of the machining learning system 601.

In various embodiments, in response to the analysis not meeting the expended experience based criteria in step 229, the process can end at step 232 as described previously herein.

In various embodiments, in response to the machine learning system 601 determining that the expanded experience based criteria is met, a system (e.g., system 280 or repair system 290) described further herein, can perform an automated and adaptive blend based on the repair blend profile from step 208, in accordance with various embodiments. In this regard, repairs of defects in bladed rotors 100 can be determined and implemented significantly faster relative to typical repair and analysis systems and methods, in accordance with various embodiments.

Figure 7:
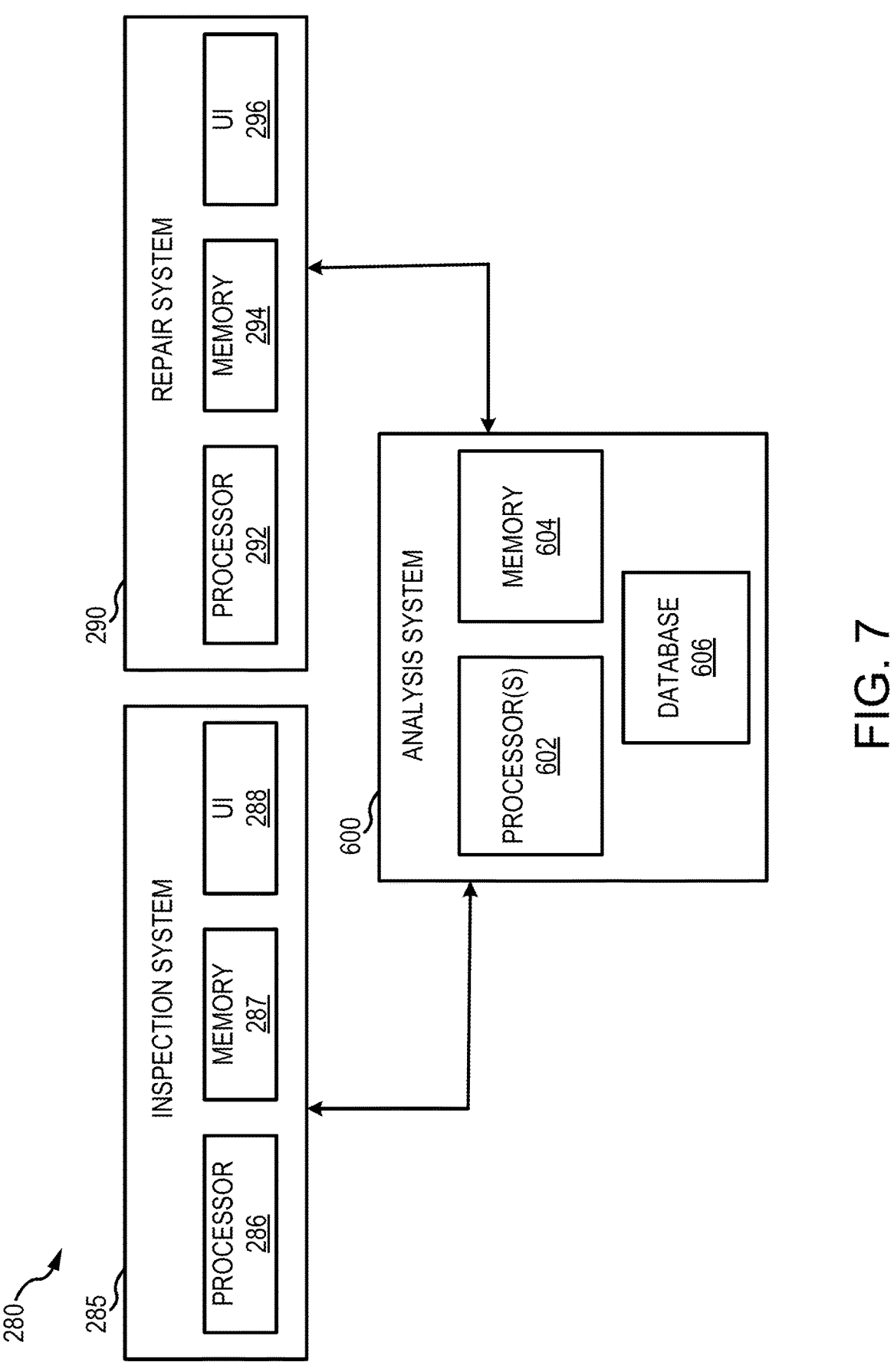
FIG. 7, illustrates a system to perform the inspection, analysis, and repair process of FIGS. 6A and 6B, in accordance with various embodiments.

Referring now to FIG. 7, a system 280 for inspecting, analyzing, and repairing an IBR 100 is illustrated, in accordance with various embodiments. In various embodiments, the system 280 includes an inspection system 285, an analysis system 600, and a repair system 290. Although illustrated as separate systems with separate processors (e.g., processors 286, 602, 292), the present disclosure is not limited in this regard. For example, the system 280 may include a single processor, a single memory, and a single user interface and still remain within the scope of this disclosure.

Similarly, although inspection system 285 and repair system 290 are illustrated as separate systems with separate processors, memories and user interfaces, the present disclosure is not limited in this regard. For example, the inspection system 285 and the repair system 290 may be combined into a single system that communicates with the analysis system 600, in accordance with various embodiments.

In various embodiments, the analysis system 600 may include one or more processors 602. The analysis system 600 may be configured to process a significant amount of data during an analysis step as described further herein. In this regard, the analysis system 600 may be configured for remote computing (e.g., cloud-based computing), or the like. Thus, a processing time and a volume of data analyzed may be greatly increased relative to typical repair systems, in accordance with various embodiments.

In various embodiments, the inspection system 285, the analysis system 600, and the repair system 290 each include a computer system comprising a processor (e.g., processor 286, processor(s) 602, and/or processor 292) and a memory (e.g., memory 287, memory 604, memory 294). The inspection system 285 and the repair system 290 may each comprise a user interface (UI) (e.g., UI 288, UI 296). In various embodiments, the inspection system 285 and the repair system 290 may utilize a single user interface to control both systems. The present disclosure is not limited in this regard.

The analysis system 600 may further comprise a database 606. In various embodiments, the database 606 comprises various stored data for use in the analysis system 600. The database 606 may include an inspected IBR database (e.g., with data from various prior inspected IBRs), a repair data database (e.g., with data from various prior repairs performed/approved), a load data database (e.g., with engine load data from structural and/or aerodynamic analysis), a test data database (e.g., with engine specific test data used for validation of structural and/or aerodynamic analysis), a design data database (e.g., with design models having nominal dimensions according to a product definition of the IBR 100), and/or a material data database (e.g., with material for each component utilized in an analysis step), in accordance with various embodiments.

System 280 may be configured for inspecting, analyzing, and repairing an IBR 100, in accordance with various embodiments. In this regard, a repair process for an IBR 100 may be fully automated, or nearly fully automated, in accordance with various embodiments, as described further herein.

In various embodiments, systems 285, 600, 290 may each store a software program configured to perform the methods described herein in a respective memory 287, 604, 294 and run the software program using the respective processor 286, 602, 292. The systems 285, 600, 290 may include any number of individual processors 286, 602, 292 and memories 287, 604, 294. Various data may be communicated between the systems 285, 600, 290 and a user via the user interfaces (e.g., UI 288, UI 296). Such information may also be communicated between the systems 285, 600, 290 and external devices, database 606, and/or any other computing device connected to the systems 285, 600, 290 (e.g., through any network such as a local area network (LAN), or wide area network (WAN) such as the Internet).

In various embodiments, for systems 285, 600, 290, each processor 286, 602, 292 may retrieve and executes instructions stored in the respective memory 287, 604, 294 to control the operation of the respective system 285, 600, 290. Any number and type of processor(s) (e.g., an integrated circuit microprocessor, microcontroller, and/or digital signal processor (DSP)), can be used in conjunction with the various embodiments. The processor 286, 602, 292 may include, and/or operate in conjunction with, any other suitable components and features, such as comparators, analog-to-digital converters (ADCs), and/or digital-to-analog converters (DACs). Functionality of various embodiments may also be implemented through various hardware components storing machine-readable instructions, such as application-specific integrated circuits (ASICs), field-programmable gate arrays (FPGAs) and/or complex programmable logic devices (CPLDs).

The memory 287, 604, 294 may include a non-transitory computer-readable medium (such as on a CD-ROM, DVD-ROM, hard drive, or FLASH memory) storing computer-readable instructions stored thereon that can be executed by the processor 286, 602, 292 to perform the methods of the present disclosure. The memory 287, 604, 294 may include any combination of different memory storage devices, such as hard drives, random access memory (RAM), read only memory (ROM), FLASH memory, or any other type of volatile and/or nonvolatile memory.

The system 285, 290 may receive and display information via a respective user interface (e.g., UI 288 and/or UI 296). The user interfaces (e.g., UI 288 and/or UI 296) include various peripheral output devices (such as monitors and printers), as well as any suitable input or control devices (such as a mouse and keyboard) to allow users to control and interact with the software program. Although illustrated as not including a user interface, the analysis system 600 is not limited in this regard. For example, a user interface for the analysis system 600 can have a user interface to facilitate load inputs, retrieval of information from the inspection system 285, or the like.

In various embodiments, inspection system 285 and repair system 290 may each be in electronic communication with analysis system 600, directly or via a respective user interface (e.g., UI 288 and/or UI 296). inspection system 285 and repair system 290 may comprise any suitable hardware, software, and/or database components capable of sending, receiving, and storing data. For example, inspection system 285 and/or repair system 290 may comprise a personal computer, personal digital assistant, cellular phone, smartphone (e.g., those running UNIX-based and/or Linux-based operating systems such as IPHONE®, ANDROID®, and/or the like), IoT device, kiosk, and/or the like. Inspection system 285 and/or repair system 290 may comprise an operating system, such as, for example, a WINDOWS® mobile operating system, an ANDROID® operating system, APPLE® IOS®, a LINUX® operating system, and the like. Inspection system 285 and/or repair system 290 may also comprise software components installed on inspection system 285 and/or repair system 290 and configured to enable access to various system 280 components. For example, inspection system 285 and/or repair system 290 may comprise a web browser (e.g., MICROSOFT INTERNET EXPLORER®, GOOGLE CHROME®, APPLE SAFARI® etc.), an application, a micro-app or mobile application, or the like, configured to allow the inspection system 285 and/or repair system 290 to access and interact with analysis system 600 (e.g., directly or via a respective UI, as discussed further herein).

Figure 8:
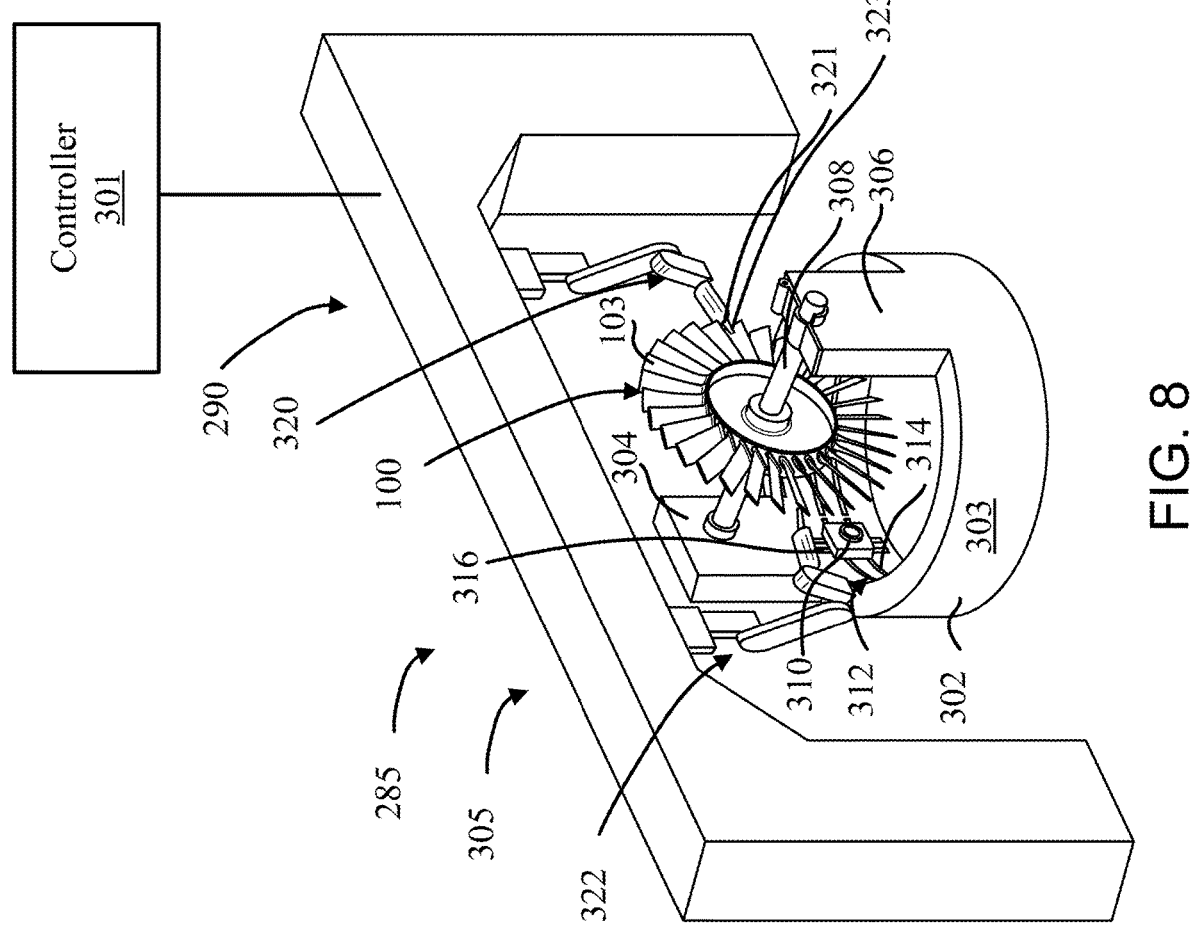
FIG. 8 illustrates an inspection and/or repair system, in accordance with various embodiments.
Figure 9:
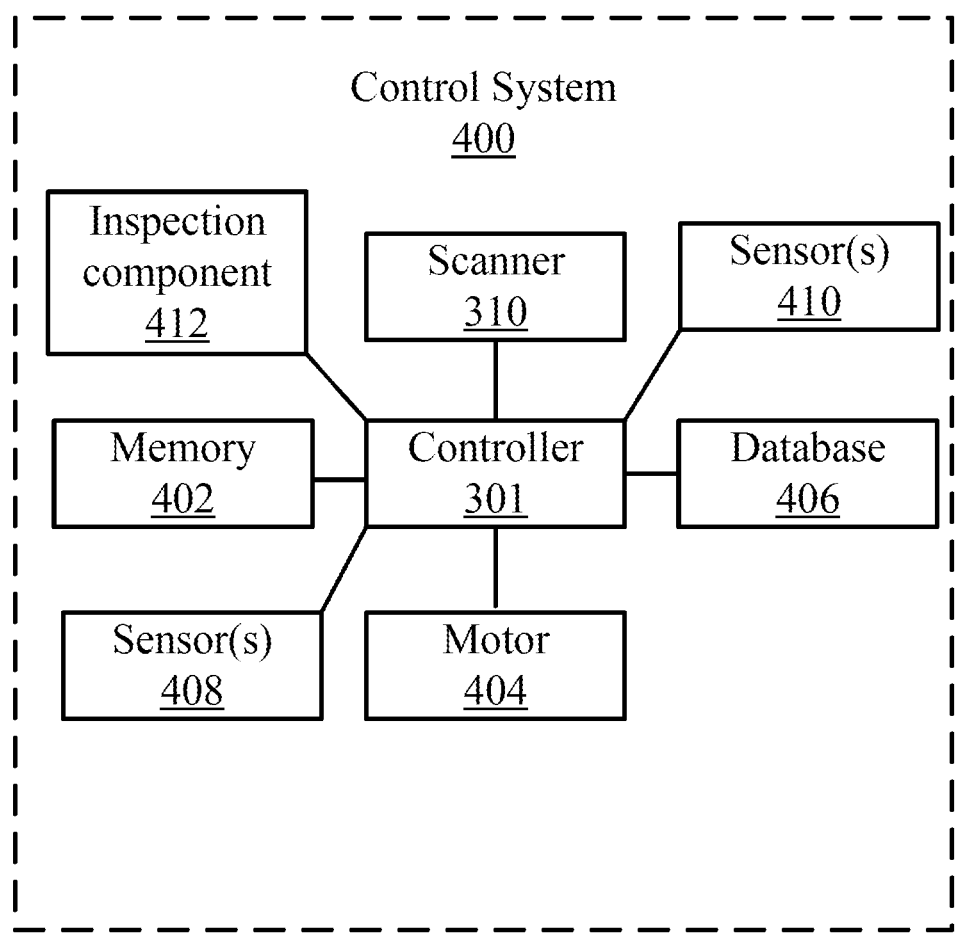
FIG. 9 illustrates a schematic view of a control system for an inspection system, in accordance with various embodiments.

Referring now to FIGS. 8 and 9, a perspective view of a system 285 for use in an inspection step 202 and/or a repair step 214 of process 200 (FIG. 8) and a control system 400 for the inspection system 285 (FIG. 9) are illustrated in accordance with various embodiments. In various embodiments, the system 285 comprises a repair system 290 and an inspection system 285. For example, various components of the system 285 may be configured to inspect the IBR 100 and generate a digital map of the IBR 100 (e.g., a point cloud), the inspection system 285 may be configured to transmit the digital map to an analysis system (e.g., analysis system 600), the inspection system 285 may then receive the results from the analysis system 600, and/or perform a repair based on a determination from the analysis system 600, in accordance with various embodiments.

The inspection system 285 comprises a controller 301, a support structure 302, a shaft 308, and a scanner 310. In various embodiments, the control system 400 comprises the controller 301, the scanner 310, a memory 402, a motor 404, a database 406, and sensor(s) 408, sensor(s) 410, and inspection component 412. In various embodiments, the inspection system 285 comprises a device 305 configured for bladed rotor repair and/or bladed rotor inspection.

In various embodiments, the support structure 302 comprises a base 303, a first vertical support 304, a second vertical support 306. In various embodiments, the base 303 may be annular in shape. Although illustrated as being annular, the present disclosure is not limited in this regard. For example, the base 303 may be semi-annular in shape, a flat plate, or the like. In various embodiments, the vertical supports 304, 306 extend vertically upward from the base 303 on opposite sides of the base (e.g., 180 degrees apart, or opposite sides if the base 303 where a square plate). The shaft 308 extends from the first vertical support 304 to the second vertical support 306. The shaft 308 may be rotatably coupled to the motor 404, which may be disposed within first vertical support 304, in accordance with various embodiments. The shaft 308 may be restrained vertically and horizontally at the second vertical support 306 but free to rotate relative to the second vertical support about a central longitudinal axis of the shaft 308. In various embodiments, a bearing assembly may be coupled to the second vertical support 306 to facilitate rotation of the shaft, in accordance with various embodiments.

In various embodiments, the IBR 100 to be inspected in accordance with the inspection step 202 of the process 200 via the inspection system 285 may be coupled to the shaft 308 (e.g., via a rigid coupling, or the like). The present disclosure is not limited in this regard, and the shaft 308 may be coupled to the IBR 100 to be inspected by any method known in the art and be within the scope of this disclosure.

In various embodiments, the scanner 310 is operably coupled to a track system 312. In various embodiments, the track system 312 may comprise a curved track 314 and a vertical track 316. The vertical track 316 may slidingly couple to the vertical track 316 (e.g., via rollers or the like). The scanner 310 may be slidingly coupled to the vertical track 316 (e.g., via a conveyor belt, linkages, or the like). In various embodiments, the scanner 310 is configured to extend from the track system 312 towards the IBR 100 during inspection of the IBR 100 in accordance with step 202 of the process 200. In this regard, the inspection system 285 may further comprise a control arm 322 (e.g., a robot arm), an actuator (e.g., in combination with the track system 312) or the like. Although described herein with tracks 314, 316. a control arm 322, and/or an actuator of track system 312, the present disclosure is not limited in this regard. For example, any electronically controlled (e.g., wireless or wired) component configured to move the scanner 310, a machining tool (e.g., a mill, a cutter, a lathe, etc.), or the like in six degrees of freedom relative to the IBR 100 is within the scope of this disclosure.

In various embodiments, the inspection component 412 comprises rollers for the curved track, a conveyor belt for the vertical track, and/or a robotic arm coupled to the scanner 310. In various embodiments, the inspection component 412 comprises only a control arm 322 (e.g., a robot arm). In various embodiments, the inspection component 412 comprises only the rollers for the curved track 314 and the conveyor belt or linkages for the vertical track 316. The present disclosure is not limited in this regard. In various embodiments, the inspection component 412 is stationary and the IBR 100 being inspected is moveable along three-axis, five-axis, or the like. The present disclosure is not limited in this regard.

In various embodiments, the scanner 310 comprises a coordinate measuring machine (CMM), a mechanical scanner, a laser scanner, a structured scanner (e.g., a white light scanner, a blue light scanner, etc.), a non-structured optical scanner, a non-visual scanner (e.g., computed tomography), or the like. In various embodiments, the scanner 310 is a blue light scanner. In various embodiments, the scanner 310 may be swapped with another scanner at any point during an inspection step 202 as described further herein. In various embodiments, the inspection system 285 may be configured to swap the scanner 310 with a different scanner during the inspection step 202 of process 200 as described further herein.

A "blue light scanner" as disclosed herein refers to a non-contact structure light scanner. The blue light scanner may have a scan range of between $100 \times 75$ mm²–$400 \times 300$ mm², in accordance with various embodiments. In various embodiments, an accuracy of the blue light scanner may be between 0.005 and 0.015 mm. In various embodiments, the blue light scanner may be able to determine distances between adjacent points in the point cloud of between 0.04 and 0.16 mm as measured across three axes. In various embodiments, a volume accuracy of the blue light scanner may be approximately 0.8 mm/m. In various embodiments, a scan depth may be between approximately 100 and 400 mm. In various embodiments, the blue light scanner may comprise a light source including a blue LED. In this regard, the blue light scanner may be configured to emit an average wavelength between 400 and 450 nm, in accordance with various embodiments. Although described with various specifications herein, the blue light scanner is not limited in this regard, and one skilled in the art may recognize the parameters of the blue light scanner may extend outside the exemplary ranges. Use of a blue light scanner provides a high resolution point cloud for a three dimensional object.

In various embodiments, the inspection system 285 further comprises a control arm 320 of the repair system 290. In various embodiments the control arm 320 comprises a tool holder 321. The tool holder 321 is configured to couple to a subtractive component 323 (e.g., a mill, a lathe, a cutter, etc.). In various embodiments, the control arm 322 of inspection system 285 may be a control arm for the repair system 290 as well. In various embodiments, the control arms 320, 322 may be used in both the repair system 290 and the inspection system 285. The present disclosure is not limited in this regard.

The controller 301 may be integrated into computer system of the inspection system 285 (e.g., in processor 286 and/or memory 287 from FIG. 2B). In various embodiments, the controller 301 may be configured as a central network element or hub to various systems and components of the control system 400. In various embodiments, controller 301 may comprise a processor (e.g., processor 286). In various embodiments, controller 301 may be implemented as a single controller (e.g., via a single processor 286 and associated memory 287). In various embodiments, controller 301 may be implemented as multiple processors (e.g., a main processor and local processors for various components). The controller 301 can be a general purpose processor, a digital signal processor (DSP), an application specific integrated circuit (ASIC), a field programmable gate array (FPGA) or other programmable logic device, discrete gate or transistor logic, discrete hardware components, or any combination thereof. The controller 301 may comprise a processor configured to implement various logical operations in response to execution of instructions, for example, instructions stored on a non-transitory, tangible, computer-readable medium configured to communicate with the controller 301.

System program instructions and/or controller instructions may be loaded onto a non-transitory, tangible computer-readable medium having instructions stored thereon that, in response to execution by a controller, cause the controller to perform various operations. The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media which were found in In Re Nuijten to fall outside the scope of patentable subject matter under 35 U.S.C. § 101.

In various embodiments, the motor 404 of the control system 400 is operably coupled to the shaft 308 of the control system 400. In various embodiments, the motor 404 may comprise a direct current (DC) stepper, an alternating current (AC) motor or the like. The present disclosure is not limited in this regard. In various embodiments, the sensor(s) 408 include Hall effect sensor(s), optical sensor(s), resolver(s), or the like. In various embodiments, sensor(s) 408 may include sensor(s) configured to detect an angular position of the shaft 308 during an inspection step for an IBR 100 (e.g., step 202 from the process 200). In this regard, during inspection of the IBR 100, the controller 301 receives sensor data from the sensor(s) 408. The controller 301 can utilize the sensor data received from the sensor(s) 408 to correlate an angular position of the IBR 100 being inspected with a location of the scanner 310 as described further herein. In various embodiments, the IBR 100 may remain stationary throughout an inspection process (e.g., inspection step 202 of process 200) and only a control arm (e.g., control arm 320 and/or control arm 322) may move. Thus, coordinates of the control arm(s) may be determined via sensor(s) 408 in a similar manner to orient and construct the IBR 100 being inspected.

In various embodiments, the sensor(s) 410 are configured to detect a position of the scanner 310 during the inspection step 202 of process 200. In this regard, sensor(s) 410 may be position sensors (e.g., capacitive displacement sensors, eddy-current sensors, Hall effect sensors, inductive sensors, optical sensors, linear variable differential transformer (LVDT) sensors, photodiode array sensors, piezoelectric sensors, encoders, potentiometer sensors, ultrasonic sensors, or the like). The present disclosure is not limited in this regard. Thus, during inspection of the IBR 100 in accordance with step 202 of process 200, controller 301 is able to determine a location of the scanner 310 and an angular position of the IBR 100 throughout the inspection. Thus, based on the location of the scanner 310, an angular location of the IBR 100 and scanning data received from the scanner 310, a digital map (e.g., a robust point cloud) can be generated during the inspection step 202 of process 200 for the IBR 100 being inspected. In various embodiments, the point cloud encompasses the entire IBR 100 (e.g., between 95% and 100% of a surface area of the IBR 100, or between 99% and 100% of the surface area of the IBR 100).

Figure 10:
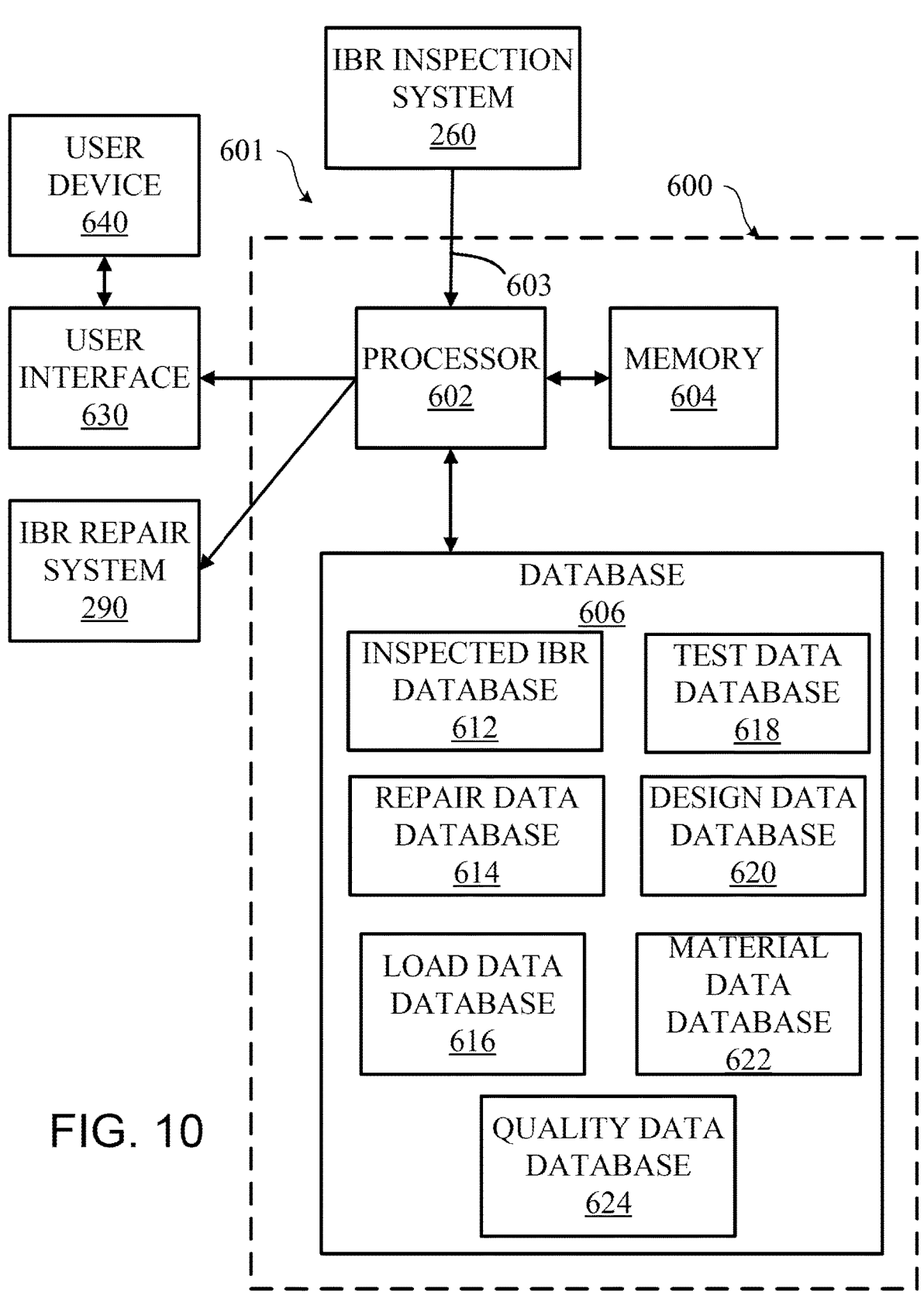
FIG. 10 illustrates a schematic view analysis system, in accordance with various embodiments.

Referring now to FIG. 10, an analysis system 600 for use in an inspection, analysis, and repair process (e.g., process 200 from FIG. 6A) as described previously herein is illustrated, in accordance with various embodiments. The analysis system 600 comprises the processor 602, the memory 604, and the database 606 from FIG. 7. In various embodiments, the analysis system 600 is a computer-based system. In various embodiments, the system 600 is a cloud-based computing system. The present disclosure is not limited in this regard. In various embodiments, the analysis system 600 comprises a machine learning system 601 (e.g., a deep neural network (DNN), an artificial neural network (ANN), or the like). In this regard, the analysis system 600 described herein can be configured for machine learning to constantly expand experience based criteria of step 212 in process 200 via step 220 as described previously herein.

The processor 602 is configured to receive an input 603 from the inspection system 285 (e.g., via the control system 400 from FIG. 7). The input 603 comprises a either a point cloud or a three-dimensional model of an IBR 100 inspected in accordance with the process described further herein. In various embodiments, in response to receiving the point cloud, the processor 602 is configured to convert the point cloud to a three-dimensional model (e.g., a finite element model (FEM) for structural analysis, a computation fluid dynamic (CFD) model for aerodynamic analysis, or any other model utilized for analysis).

In various embodiments, the analysis system 600 may include a port configured to couple to a hard drive, or any other device configured to transfer data obtained from inspecting the IBR 100 in step 202 of process 200. In various embodiments, the processor 602 may be in direct electronic (e.g., wireless or wired) communication with the inspection system 285 from step 202 of process 200. In various embodiments, the processor 602 is configured to communicate with the IBR inspection system over a network, or the like. The present disclosure is not limited in this regard.

In various embodiments, the processor 602 is in communication with a user interface ("UI") 630, which includes a user device 640. The analysis system 600 can be configured for determining a repaired IBR 170 having repair blend profiles 160 as shown in FIGS. 5A-D, in accordance with various embodiments. In this regard, the processor 602 of the analysis system 600 is configured to receive an input 603 (e.g., from the inspection system 285 of step 202 in process), perform various simulations and analyze the various simulations (e.g., in steps 210, 222, 224, 226, and/or 228), and output at the repair blend profiles 160 for respective defects 140 of the IBR 100. In various embodiments, the analysis system 600 may be configured to perform simulations based on the stack of IBRs 110 from FIG. 1B. Each IBR in the stack of IBRs 110 can be an IBR 100 that was inspected in step 202 of process 200. In this regard, a higher fidelity analysis can be performed in steps 222, 224, 226, 228 at a system level for IBR that don't meet the deterministic criteria in step 230 but could meet the deterministic criteria in step 230 based on a modification of an IBR 100 in the stack of IBRs 100. In this regard, the input 603 may comprise a point cloud or a three-dimensional model for each IBR 100 in a stack of IBRs 110 from FIG. 1B that have been inspected in accordance with process 500, in accordance with various embodiments.

In various embodiments, the database 606 includes an inspected IBR database 612 including available IBRs 100 for use in a stack of IBRs 110. In this regard, the analysis system 600 may be configured to mix and match IBRs 100, which were on different gas turbine engines 20 from FIG. 1A previously, based on an optimal repair process, in accordance with various embodiments.

In various embodiments, the analysis system 600 may store a software program configured to perform the methods described herein in the memory 604 and run the software program using the processor 602. The analysis system 600 may include any number of individual processors 602 and memories 604. Various data may be communicated between the analysis system 600 and a user via the UI 630 and/or the inspection system 285. Such information may also be communicated between the analysis system 600 and any other external devices (e.g., a computer numerical control (CNC) machine, an additive manufacturing machine, such as a directed energy deposition (DED) machine, etc.), and/or any other computing device connected to the analysis system 600 (e.g., through any network such as a local area network (LAN), or wide area network (WAN) such as the Internet).

In various embodiments, the processor 602 of the analysis system 600 retrieves and executes instructions stored in the memory 604 to control the operation of the analysis system 600.

In various embodiments, the database 606 comprises various stored data for use in the analysis system 600 as described further herein. The database 606 may include an inspected IBR database 612, a repair data database 614, a load data database 616, a test data database 618, a design data database 620, and/or a material data database 622, in accordance with various embodiments.

In various embodiments, the inspected IBR database 612 comprises one of a point cloud or a three-dimensional model of inspected IBRs 100 received from the inspection system 285 that are awaiting repair in step 214 of the process 200. In this regard, the inspected IBR database 612 may include unrepaired IBRs 100 for use in the simulation and analysis steps of process 200 (e.g., steps 210, 222, 224, 226, and/or 228). Although described herein as including the inspected IBR database 612, the present disclosure is not limited in this regard. For example, repair options may be determined for an IBR 100 individually without analysis related to other IBRs 100 in the stack of IBRs 110 from FIG. 1B, in accordance with various embodiments. Similarly, repair options may be determined for one or more blades 103 of an IBR 100 individually without analysis related to other blades 103 for the IBR 100, in accordance with various embodiments. However, by increasing the scope to the IBR 100 component level and/or to the rotor module 111 level as described further herein, more optimal repair options may be determined (e.g., based on cost, time, amount of material removed, etc.), an IBR 100 which may have had a previously unrepairable airfoil determined at a blade level may be repairable based on a component level or module level analysis, and/or blending an airfoil without a defect to offset module or component level effects (e.g., mistuning, aerodynamic capability, etc.), in accordance with various embodiments.

In various embodiments, the repair data database 614 includes previously performed repairs (e.g., blend shapes, additive repair shapes, etc.). In this regard, the repair data database 614 may include any structural debits, aerodynamic debits or the like associated with the previously performed repairs for other IBRs (i.e., not the IBR being inspected). As such, as more repairs are determined, performed, and tested, the repair data database may become more robust, improving the analysis system 600 the more the analysis system 600 is utilized, in accordance with various embodiments.

In various embodiments, the load data database 616 comprises boundary conditions for the gas turbine engine 20 for use in structural analysis and aerodynamic analysis as described further herein. In this regard, for structural analysis, the boundary conditions may include temperature (i.e., highest expected blade temperature, lowest expected blade temperature, etc.), rotor speed (e.g., max rotor speed, typical rotor speed, rotor speed as a function of flight cycle, etc., rotor speed generating modal response, etc.), or any other boundary condition for the IBR 100, the stack of IBRs 110, or the high pressure compressor 52. In various embodiments, module level boundary conditions may include stack stiffness, clocking, clearances (cases, tips, back-bone bending, etc.), blade counts, axial gapping, imbalance, secondary flow influence, or the like.

In various embodiments, the test data database 618 includes engine test data associated with the IBR 100, the stack of IBRs 110, and/or the rotor module 111. For example, prior to certifying a gas turbine engine 20 from FIG. 1A for production, assumptions with respect to structural analysis performed during a design stage of development may be validated and verified through engine testing. During engine testing, strain gauges may be coupled in various locations on an IBR 100 (e.g., expected high stress locations based on the structural analysis). In response to receiving strain gauge data from the engine testing, analytical or predicted results from the structural analysis can be scaled using actual or measured results to correlate the model to actual data from the engine testing. Thus, the test data database 618 comprises actual test data to be used for scaling predicted data of the analysis system 600 during processes described further herein.

In various embodiments, the design data database 620 comprises three-dimensional models of surrounding components (e.g., blade stages 101, exit guide vane stage 106, outer engine case 120, etc.). In this regard, the analysis system 600 may be configured to prepare a structural model (e.g., via ANSYS, ANSYS Workbench, etc.) and/or a computational fluid dynamics (CFD) model with the surrounding components and the input 603 received from the inspection system 285 and run various simulations with various repair options to determine an optimal repair for an IBR 100, for each IBR 100 in a stack of IBRs 110, or for matching repairs of IBRs 100 for various performance parameters (e.g., aerodynamic operability, mistuning, etc.). In various embodiments, the design data database further comprises an original design of the IBR being inspected. In this regard, an original three-dimensional model of the IBR 100 being inspected with nominal dimensions (i.e., nominal in accordance with a product definition of the IBR), in accordance with various embodiments.

In various embodiments, the material data database 622 comprises material data corresponding to a material of the IBR 100. In various embodiments, the IBR 100 is made of an iron-based alloy (e.g., stainless steel), nickel-based alloy, a titanium alloy, or the like. The present disclosure is not limited in this regard. In various embodiments, material properties for the material the IBR 100 is made of are stored in the material data database 622. In this regard, in response to performing a structural analysis via the IBR analysis system, the empirical results (after being scaled based on test data from the test data database 618) may be compared to a threshold zone of acceptance (e.g., a Goodman diagram with steady state stress compared to vibratory stress), where the threshold zone of acceptance is based on the material properties and a margin of safety, in accordance with various embodiments.

In various embodiments, after the processor 602 performs the various processes disclosed further herein, the processor 602 may output at least one repair process for a respective IBR 100 to the user device (e.g., through the UI 630, directly to the user device 640, or the like). In various embodiments, the output may comprise manual instructions for a blend repair process, a computer numerical control ("CNC") machining process (e.g., blending or the like). In various embodiments, the processor 602 sends CNC machining instructions to the repair system 290 directly, and the repair system 290 repairs the IBR 100 to generate a repaired IBR 170 from FIG. 5A, in accordance with various embodiments.

In various embodiments, the database 606 includes an inspected IBR database 612 including available IBRs 100 for use in a stack of IBRs 110 (i.e., as determined in step 232 of process 200). In this regard, the analysis system 600 may be configured to mix and match IBRs 100, which were on different gas turbine engines 20 from FIG. 1A previously, based on IBRs 100 not meeting deterministic criteria at a component level, in accordance with various embodiments.

In various embodiments, the analysis system 600 may store a software program configured to perform the methods described herein in the memory 604 and run the software program using the processor 602. The analysis system 600 may include any number of individual processors 602 and memories 604. Various data may be communicated between the analysis system 600 and a user via the UI 630 and/or the inspection system 285. Such information may also be communicated between the analysis system 600 and any other external devices (e.g., a computer numerical control ("CNC") machine, etc.), and/or any other computing device connected to the analysis system 600 (e.g., through any network such as a local area network (LAN), or wide area network (WAN) such as the Internet).

In various embodiments, the processor 602 of the analysis system 600 retrieves and executes instructions stored in the memory 604 to control the operation of the analysis system 600.

In various embodiments, the database 606 comprises various stored data for use in the analysis system 600 as described further herein. The database 606 may include an inspected IBR database 612, a repair data database 614, a load data database 616, a test data database 618, a design data database 620, a material data database 622, and/or a quality data database 624 in accordance with various embodiments.

In various embodiments, the inspected IBR database 612 comprises one of a point cloud or a three-dimensional model of inspected IBRs 100 received from the inspection system 285 that are awaiting repair in step 214 of process 200 or did not meet deterministic criteria in step 230 of process 200. In this regard, the inspected IBR database 612 may include unrepaired IBRs 100 for use in system level analysis of a stack of IBRs 110, in accordance with various embodiments. In various embodiments by increasing the scope to the IBR 100 component level and/or to the rotor module 111 level, inspected IBRs that would otherwise be scrapped could potentially be combined in a stack of IBRs to meet satisfy structural criteria and system level aerodynamic criteria, in accordance with various embodiments.

In various embodiments, the repair data database 614 includes previously performed repairs (e.g., blend shapes). In this regard, the repair data database 614 may include any structural debits, aerodynamic debits or the like associated with the previously performed repairs for other IBRs (i.e., not the IBR being inspected). As such, as more repairs are determined, performed, and tested, the repair data database may become more robust, improving the analysis system 600 the more the analysis system 600 is utilized, in accordance with various embodiments.

In various embodiments, the load data database 616 comprises boundary conditions for the gas turbine engine 20 for use in structural analysis and aerodynamic analysis as described further herein. In this regard, for structural analysis, the boundary conditions may include temperature (i.e., highest expected blade temperature, lowest expected blade temperature, etc.), rotor speed (e.g., max rotor speed, typical rotor speed, rotor speed as a function of flight cycle, etc., rotor speed generating modal response, etc.), or any other boundary condition for the IBR 100, the stack of IBRs 110, or the high pressure compressor 52. In various embodiments, module level boundary conditions may include stack stiffness, clocking, clearances (cases, tips, back-bone bending, etc.), blade counts, axial gapping, imbalance, secondary flow influence, or the like.

In various embodiments, the test data database 618 includes engine test data associated with the IBR 100, the stack of IBRs 110, and/or the rotor module 111. For example, prior to certifying a gas turbine engine 20 from FIG. 1A for production, assumptions with respect to structural analysis performed during a design stage of development may be validated and verified through engine testing. During engine testing, strain gauges may be coupled in various locations on an IBR 100 (e.g., expected high stress locations based on the structural analysis). In response to receiving strain gauge data from the engine testing, analytical or predicted results from the structural analysis can be scaled using actual or measured results to correlate the model to actual data from the engine testing. Thus, the test data database 618 comprises actual test data to be used for scaling predicted data of the analysis system 600 during processes described further herein.

In various embodiments, the design data database 620 comprises three-dimensional models of surrounding components (e.g., blade stages 101, exit guide vane stage 106, outer engine case 120, etc.). In this regard, the analysis system 600 may be configured to prepare a structural model (e.g., via ANSYS, ANSYS Workbench, etc.) and/or a computational fluid dynamics (CFD) model with the surrounding components and the input 603 received from the inspection system 285 and run various simulations with various repair options to determine an optimal repair for an IBR 100, for each IBR 100 in a stack of IBRs 110, or for matching repairs of IBRs 100 for various performance parameters (e.g., aerodynamic operability, mistuning, etc.) (i.e., for component level analysis in steps 222, 224, 226 228, and/or for system level analysis performed after step 232 in process

200). In various embodiments, the design data database further comprises an original design of the IBR being inspected. In this regard, an original three-dimensional model of the IBR 100 being inspected with nominal dimensions (i.e., nominal in accordance with a product definition of the IBR), in accordance with various embodiments.

In various embodiments, the material data database 622 comprises material data corresponding to a material of the IBR 100. In various embodiments, the IBR 100 is made of an iron-based alloy (e.g., stainless steel), nickel-based alloy, a titanium alloy, or the like. The present disclosure is not limited in this regard. In various embodiments, material properties for the material the IBR 100 is made of are stored in the material data database 622. In this regard, in response to performing a structural analysis via the analysis system 600 (e.g., steps 210, 222, 224), the empirical results (after being scaled based on test data from the test data database 618) may be compared to a threshold zone of acceptance (e.g., a Goodman diagram with steady state stress compared to vibratory stress), where the threshold zone of acceptance is based on the material properties and a margin of safety, in accordance with various embodiments.

In various embodiments, the quality data database 624 comprises quality data associated with various quality information/dispositions for a known defect shapes, sizes, etc. For example, quality data (e.g., an estimated remaining life, or the like), associated with a known defect can be used for a defect having a size and shape corresponding to a known defect associated with a prior quality determination. In this regard, historical quality data can be utilized by the analysis system 600 for making dispositions and determinations for an inspected IBR as described further herein, in accordance with various embodiments.

Referring now to FIG. 11, a process 700 performed by the IBR analysis system 600 is illustrated, in accordance with various embodiments. The process 700 comprises receiving, via the processor 602, a digital representation for an inspected IBR 100 (step 702). The digital representation may be received from the IBR inspection system 300 as described previously herein. In various embodiments, in response to receiving a digital representation, the processor 602 may convert an ideal IBR model to an inspected IBR model based on the digital representation. In this regard, either the inspection system 285 or the analysis system 290 may convert a point cloud obtained during the inspection step 202 of process 200 into a digital representation of the inspected IBR to be transferred, and still be within the scope of this disclosure.

In various embodiments, the process 700 further comprises comparing, via the processor 602, the three-dimensional model to a three-dimensional design model for the inspected IBR 100 (step 704). In this regard, the three-dimensional model from step 702 may be compared to nominal dimensions of the three-dimensional design model from the design data database 620. In this regard, a difference between nominal dimensions and inspected dimensions may be calculated locally across the inspected IBR 100. Thus, the difference may be compared to tolerances associated with a product definition (e.g., geometric dimensioning and tolerancing) of the IBR 100. In various embodiments, the product definition for the IBR 100 and the three-dimensional design model for the IBR 100 may be obtained from the design data database 620.

As described previously herein, the inspection system 285 defines a datum for the IBR 100 being inspected and generates a point cloud relative to the datum based on data received from the scanner 310 and sensor(s) 408, 410. In this regard, the point cloud developed from inspection system 285 defines a vast number of discretized points representing the three-dimensional external surfaces of the IBR 100 being inspected. Thus, in step 704, the processor 602 may calculate a difference of each point in the point cloud received from the inspection system 285 and the closest point to an external surface of the three-dimensional design model from step 702. The difference calculated may then be compared to a tolerance associated with the point in the point cloud (e.g., a profile tolerance or the like).

In various embodiments, the process 700 further comprises determining, via the processor 602, a defect based on the comparison (step 706). In this regard, a defect may be determined based on the difference being outside tolerances in a respective local location of the IBR 100. For example, a leading edge of the IBR 100 may be 0.05 inches (0.125 cm) outside of tolerance at a local location. Thus, step 706 may determine that the local location is a defect and proceed to step 708. In various embodiments, defects may be determined during the inspection step 202 of process 200. For example, the inspection system 285 may be configured to determine a defect in an inspected IBR 100 and increase a scan of the defect to provide additional detail for the defect, in accordance with various embodiments.

The process 700 further comprises comparing, via the processor 602, the defect to a plurality of known defects from a repair data database 614 (step 708). In this regard, the repair data database 614 may include various defects, which went through the process 200 previously. In various embodiments, the comparison includes a location of the defect (e.g., a leading edge, a trailing edge, a tip, a transition from airfoil surface to platform, etc.), a defect size (e.g., 0.05 inches (0.125 cm), 0.02 inches (0.045 cm), or the like), and/or a defect shape (e.g., semi-spherical, oval, elongated, etc.).

The process 700 further comprises determining, via the processor 602, whether the defect matches a repaired defect in the plurality of known defects (step 710). "Matches" as disclosed herein refers to the repaired defect being in the location of the repaired defect and the defect having between 90% and 100% similarity to the defect size and the defect shape, or between 95% and 100% similarity to the defect size and the defect shape, or between 98% and 100% similarity to the defect size and the defect shape.

The process 700 further comprises generating, via the processor 602, a repair process associated with the repaired defect in response to determining the defect matches the repaired defect (step 712). In various embodiments, the repair process may be manual repair instructions generated and sent to the user device 640 (e.g., through the UI 630). In various embodiments, the repair process is associated with a CNC machine and output directly to the CNC machine or in a computer-readable format configured to be transferred to a CNC machine. In various embodiments, the repair process is associated with an additive manufacturing process (e.g., DED, powder bed diffusion, binder jetting, sheet lamination, extrusion, jetting, vat photopolymerization, etc.). In various embodiments, the repair process may be output directly to an additive manufacturing machine. In various embodiments, the repair process may be output to an additive manufacturing machine in a computer-readable format configured to be transferred to the CNC machine (e.g., via a universal serial bus (USB) drive or the like). The present disclosure is not limited in this regard.

In various embodiments, the process 700 further comprises performing the repair process (step 714). In this regard, based on the analysis in steps 702-712, a repair process may be determined for a defect significantly faster compared to typical repair processes for IBRs 100. In particular, potential repair options for defects are typically analyzed for structural considerations, aerodynamic considerations, etc. as described previously herein. Instead, process 700 provides an efficient process for determining a repair process for a defect of an IBR 100, in accordance with various embodiments.

Figure 12:
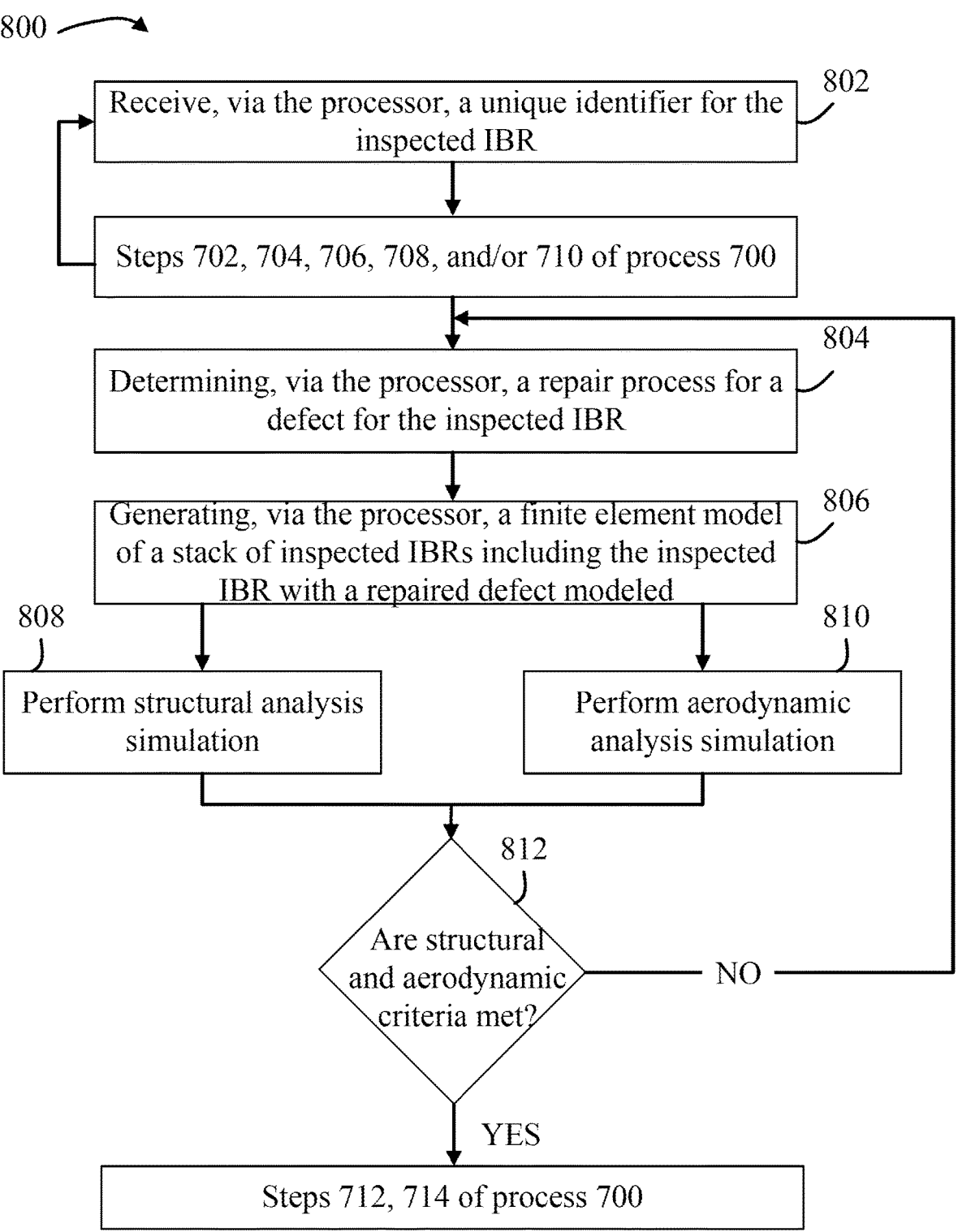
FIG. 12 illustrates a process performed by the integrally bladed rotor analysis system, in accordance with various embodiments.

Referring now to FIG. 12, a process 800 performed by the analysis system 600 is illustrated, in accordance with various embodiments. The process 800 comprises receiving, via the processor 602, a unique identifier for the inspected IBR 100 (step 802). In various embodiments, the IBR inspection system 300 is configured to scan the inspected IBR 100. In response to scanning the IBR 100, the scanner detects a barcode, a QR code, a radio frequency identification (RFID) tag or any other method or system for identifying an item (hereinafter the "unique identifier"). In this regard, a location of the IBR 100 in a stack of IBRs 110 may be determined.

In various embodiments, the process 800 further comprises receiving, via the processor 602, one of a point cloud or a three-dimensional model for the inspected IBR 100 (step 802), comparing, via the processor, the three-dimensional model to a three-dimensional design model for the inspected IBR 100 (step 804), and determining, via the processor 602, a defect based on the comparison (step 806), comparing, via the processor 602, the defect to a plurality of known defects from a repair data database 614 (step 708), and/or determining, via the processor 602, whether the defect matches a repaired defect in the plurality of known defects (step 710).

In various embodiments, the process 800 further comprises repeating steps 802, 702, 704, 706, 708, and/or 710 until the point cloud or three-dimensional model for a stack of inspected IBRs 110, a location of each defect in the stack of inspected IBRs is obtained, and/or a number of matched repaired defects in the stack of inspected IBRs 110 are determined. In various embodiments, the process 800 may be repeated until several stacks of inspected IBRs 110 and their respective defects are obtained. The present disclosure is not limited in this regard.

The process 800 further comprises determining, via the processor, a repair process for a defect for the inspected IBR (step 804). In various embodiments, steps 702-710 may determine repair process that match previously utilized repair process in accordance with process 700. In various embodiments, inspected IBR includes a defect that does not match a repaired defect in the plurality of defects from the repair data database 614. In this regard, a new repair process and/or defect repair shape is to be determined for the defect of the inspected IBR. In various embodiments, based on a plurality of repaired defects in the stack of IBRs determined from step 710, a repair process and a resultant repaired defect shape may be determined for the defect of the inspected IBR. In this regard, the resultant repaired defect shape and the repair process may not be limited by a product definition of a design model of the IBR from the design data database 620. Stated another way, the resultant repaired defect shape may be outside of tolerances associated with a product definition of the design model for the inspected IBR as long as structural and aerodynamic criteria of the stack of IBRs is maintained as described further herein. In various embodiments, the new repair process and/or defect shape may be at a location distinct from the defect. For example, based on the structural and/or aerodynamic model from steps 808, 810, the process 800 may determine repairing a location where a defect is not located may resolve an aerodynamic or structural related issue. For example, an inspected IBR 100 may be determined to have a mistuning issue that cannot be remedied at a location of a defect causing the mistuning issue. In this regard, based on process 800, the IBR analysis system 600 may determine modifying, or blending, a non-defect location may result in a properly tuned repaired IBR, in accordance with various embodiments.

In various embodiments, the process 800 further comprises generating, via the processor 602, a digital model for a stack of inspected IBRs with the inspected IBR including the resultant repaired defect shape (step 806). In various embodiments, the digital model can be a finite element model (e.g., an ANSYS model or the like) for structural analysis or an aerodynamic model (e.g., a CFD model or the like) for aerodynamic analysis. In various embodiments, both models can be generated. In various embodiments, the process further comprises performing a structural analysis simulation of the stack of IBRs (step 808) and performing an aerodynamic analysis simulation (step 810) in parallel. Although depicted as being performed in parallel the present disclosure is not limited in this regard. For example, the structural analysis and the aerodynamic analysis may be performed in series and still be within the scope of this disclosure. However, by performing the processes in parallel, the process 200 from FIG. 6A may be completed more efficiently, in accordance with various embodiments.

In various embodiments, the boundary conditions of the structural analysis simulation from step 808 and the aerodynamic analysis simulation from step 810 may be received from the load data database 616 as described previously herein. In various embodiments, the boundary conditions may further comprise surrounding components (e.g., vane stages 105, outer engine case 120, etc.) modeled in step 806 with the stack of inspected IBRs to provide a full simulation of the engine environment. In various embodiments, low cycle fatigue, high cycle fatigue, modal assurance criterion, vibration crack growth, etc. may be scaled based on engine test data from the test data database 618 as described previously herein.

In various embodiments, the process 800 further comprises determining whether structural and aerodynamic criteria were met for the stack of IBRs (step 812). If both the structural and aerodynamic criteria were not met, the process reverts back to before step 804. In various embodiments, if the structural and/or aerodynamic criteria is not met, a new stack of IBRs may be for steps 804-812. In various embodiments, if the structural and/or aerodynamic criteria is not met, the steps 804-812 of process 800 are repeated with a different repair process based on learning from the structural simulation in step 808 and the aerodynamic simulation in step 810. In this regard, the processor 602 may be configured for machine learning (e.g., an artificial neural network (ANN) or the like). Thus, recommended repair processes and repair shapes may be improved as process 800 is repeated over time by the processor 602. In various embodiments, if the structural and the aerodynamic criteria are both met, steps 712, 714 of process 700 may be repeated to repair the inspected IBR with the resultant repaired defect shape and the repair process determined from step 804.

Figure 13:
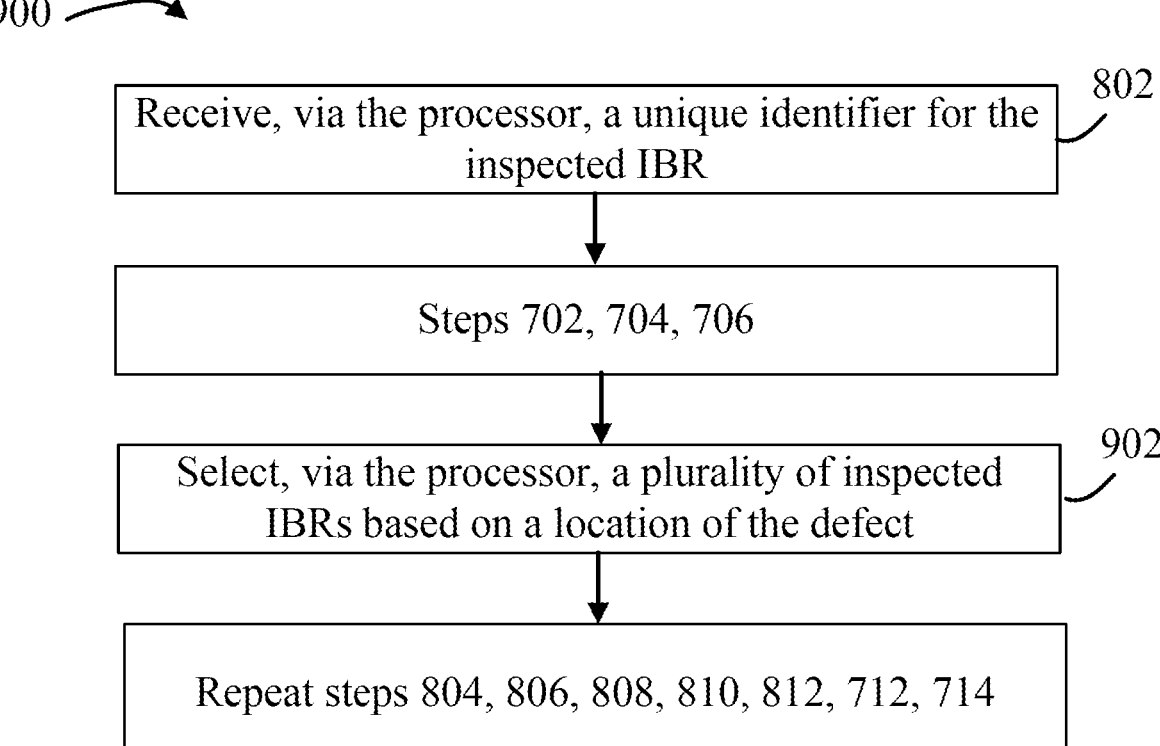
FIG. 13 illustrates a process performed by the integrally bladed rotor analysis system, in accordance with various embodiments.

Referring now to FIG. 13, a process 900 performed by the analysis system 600 is illustrated, in accordance with various embodiments. In various embodiments, after receiving the unique identifier for the inspected IBR (step 802), determining a location of a defect of the inspected IBR and an associated location and size of the defect in steps 702, 704, 706, the process 900 may further comprise selecting, via the processor 602, a plurality of inspected IBRs to form a stack of inspected IBRs (step 902). In various embodiments, the plurality of inspected IBRs may be selected based on the associated location and the size of the defect. For example, for a particularly large defect, the plurality of inspected IBRs selected in step 902 may include little to no defects. In this regard, an aerodynamic performance of the stack of inspected IBRs after repair may be maintained (e.g., within acceptable criteria), where the defect of the inspected IBR may have been otherwise unsalvageable (i.e., incapable of repairing to within tolerances of the product definition of the design model from design data database 620). Similarly, in response to the defect being relatively small, inspected IBRs in the plurality of inspected IBRs selected in step 902 may include IBRs with larger defects or defects that, when repaired, compliment a repair of the inspected IBRs defect. In this regard, based on test data from test data database 618 and load data from load data database 616, as well as data obtained from process 800, a stack of IBRs may be selected based on meeting aerodynamic and/or structural criteria by balancing IBRs with little to no defects with IBRs with larger defects which may not be repairable within the tolerances of the product definition for the respective IBRs, in accordance with various embodiments.

Figure 14:
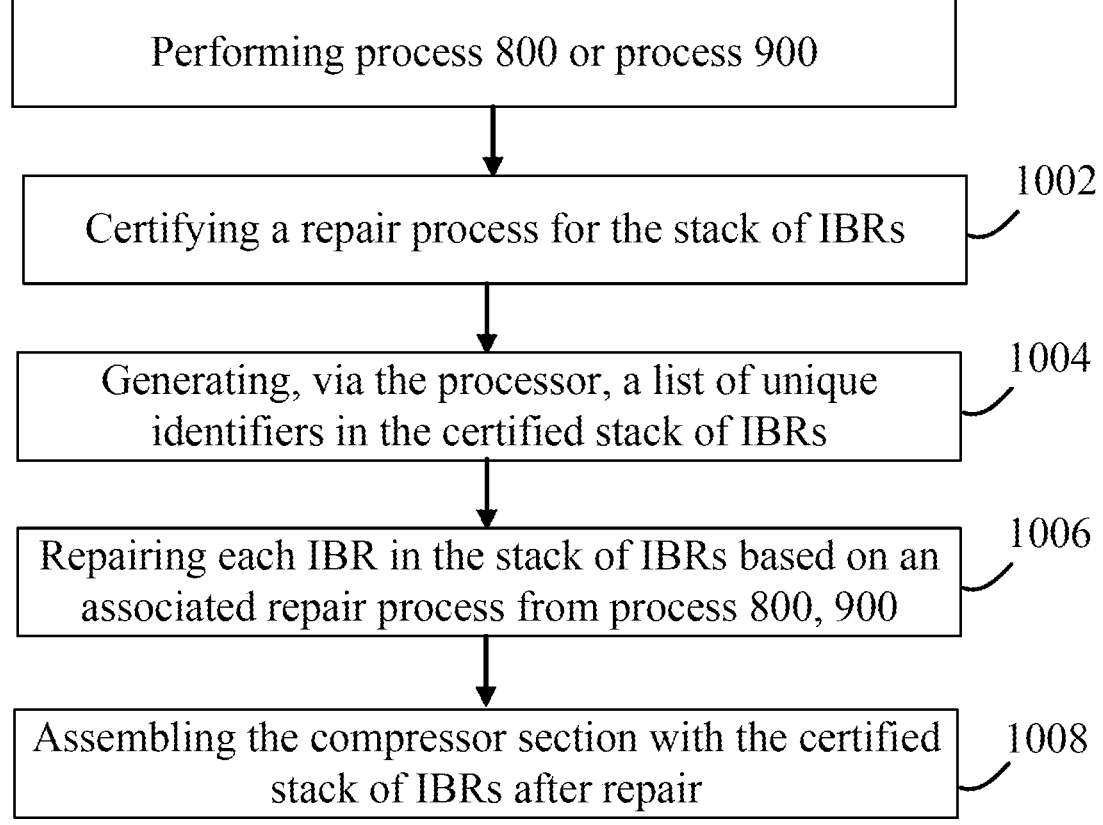
FIG. 14 illustrates a process performed by the integrally bladed rotor analysis system, in accordance with various embodiments.

In various embodiments, the process 900 further comprises repeating steps 804, 806, 808, 810, 812, 712, and 714 from process 800. Referring now to FIG. 14, after performing process 800 or process 900, the process 800, 900 may further comprise certifying repair processes for each IBR in the stack of inspected IBRs together (step 1002). In this regard, as the repair process and repair shape of defects in inspected IBRs are based on structural capabilities and aerodynamic performance of the rotor module 111 after the repairs, the repair processes determined for each defect are correlated to the stack of IBRs utilized in the simulations from steps 808, 810. Thus, the process 800, 900, may further comprise generating, via the processor, a list of unique identifiers in the certified stack of IBRs (step 1004), repairing each IBR in the stack of certified IBRs based on associated repair processes for each defect in the stack of certified IBRs (step 1006), and assembling a compressor section 24 of the gas-turbine engine 20 from FIG. 1A with the certified stack of IBRs after repair (step 1008).

Figure 15:
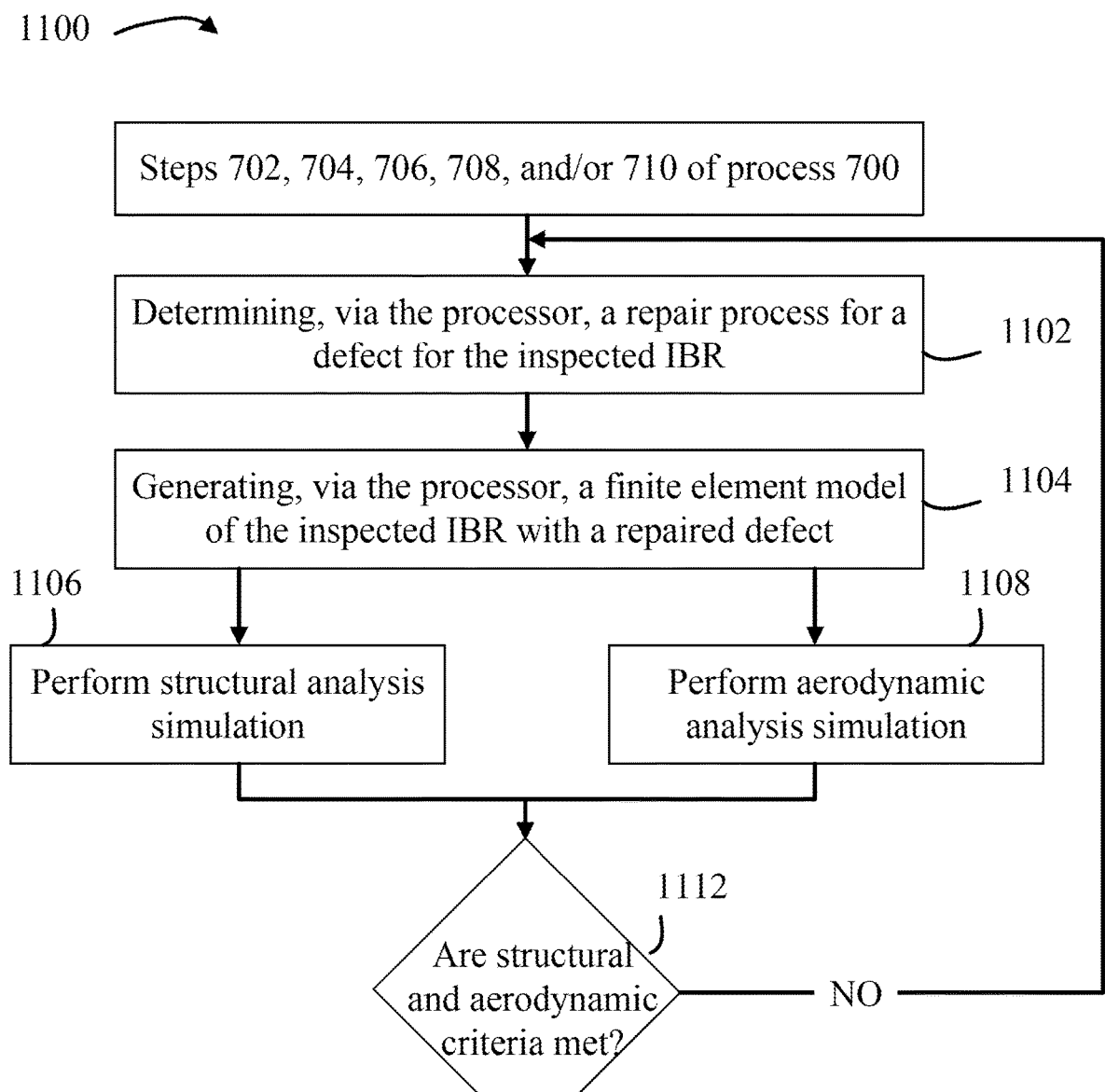
FIG. 15 illustrates a process performed by the integrally bladed rotor analysis system, in accordance with various embodiments.

In various embodiments, the process 800 from FIG. 8 may be performed by the IBR analysis system 600 at the component level (e.g., at the IBR level), or at the blade 103 level. For example, with reference to FIG. 15, a process 1100 of determining a repair for a defect based on a component level analysis is illustrated, in accordance with various embodiments. The process 1100 comprises performing steps 702, 704, 706, 708, and/or 710 of process 700. The process 1100 further comprises determining, via the processor 602, a repair process for any remaining defects of the inspected IBR (step 1102).

In various embodiments, the process 1100 further comprises generating, via the processor, digital models of the inspected IBR with a repaired defect from step 1102 and any other repaired defects determined from step 710. In various embodiments, the digital models can include a finite element model for structural analysis and an aerodynamic model for aerodynamic analysis. In various embodiments, the process 1100 further comprises performing a structural analysis simulation of the finite element model (step 1106) and an aerodynamic analysis simulation of the aerodynamic model (step 1108) of the inspected IBR in parallel. In various embodiments, steps 806 and 808 are in accordance with steps 808 and 810 of process 800 with the exception that they are performed at the component level. In this regard, in a similar manner to steps 808 and 810 of process 800, the boundary conditions of the structural analysis simulation from step 1106 and the aerodynamic analysis simulation from step 1108 may be received from the load data database 616 as described previously herein. In various embodiments, the boundary conditions may further comprise surrounding components (e.g., vane stages 105, outer engine case 120, adjacent blade stages 101, etc.) modeled in step 1104 with inspected IBR to provide a full simulation of the engine environment. In various embodiments, low cycle fatigue, high cycle fatigue, modal assurance criterion, vibration crack growth, etc. may be scaled based on engine test data from the test data database 618 as described previously herein. In this regard, a repair shape and a repair process may be determined in step 804 that is outside of tolerances of a product definition for the inspected IBR, yet be certified for repair based on process 1100, in accordance with various embodiments. In this regard, the process 1100 may reduce scrapped IBRs, resulting in significant cost reductions relative to typical repair methods and systems.

In various embodiments, after the structural analysis simulation (step 1106) and the aerodynamic analysis simulation (step 1108), the processor 602 determines whether the structural and aerodynamic criteria are met for the inspected IBR at the component level (step 1112). Step 1112 is in accordance with step 812 from process 800 with the exception that step 1112 is analyzed at the component level.

In various embodiments, after a certain number of iterations (e.g., 10 or more), the processes 800, 900, 1100 may determine that the inspected IBR has to be scrapped. In this regard, the processes 800, 900, 1100 may continue to iterate to attempt to develop a repair process that meets structural and aerodynamic capabilities for a repaired IBR for a pre-determined number of times prior to determining that a repair is not feasible and the IBR should be scrapped.

In various embodiments, after a certain number of iterations (e.g., 5 or more), the processes 800, 900 may begin performing analysis at slightly different rotor speeds for the stack of IBRs. In this regard, based on analyzing the IBRs at a module level (e.g., at the rotor module 111 level), operability parameters (e.g., rotor speed or the like) may be modified for a gas turbine engine 20 from FIG. 1A in order to accommodate a repair process for an IBR that may have otherwise been scrapped. In this regard, the processor 602 may further output a rotor speed that could accommodate a repair process if the IBR would have otherwise been scrapped. In various embodiments, the process 800, 900 may further comprise modifying the FADEC to facilitate operating the rotor with the inspected IBR at a rotor speed that is different from an initial rotor speed.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods, and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Numbers, percentages, or other values stated herein are intended to include that value, and also other values that are about or approximately equal to the stated value, as would be appreciated by one of ordinary skill in the art encompassed by various embodiments of the present disclosure. A stated value should therefore be interpreted broadly enough to encompass values that are at least close enough to the stated value to perform a desired function or achieve a desired result. The stated values include at least the variation to be expected in a suitable industrial process, and may include values that are within 10%, within 5%, within 1%, within 0.1%, or within 0.01% of a stated value. Additionally, the terms "substantially," "about" or "approximately" as used herein represent an amount close to the stated amount that still performs a desired function or achieves a desired result. For example, the term "substantially," "about" or "approximately" may refer to an amount that is within 10% of, within 5% of, within 1% of, within 0.1% of, and within 0.01% of a stated amount or value.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Finally, it should be understood that any of the above described concepts can be used alone or in combination with any or all of the other above described concepts. Although various embodiments have been disclosed and described, one of ordinary skill in this art would recognize that certain modifications would come within the scope of this disclosure. Accordingly, the description is not intended to be exhaustive or to limit the principles described or illustrated herein to any precise form. Many modifications and variations are possible in light of the above teaching.

What is claimed is:

1. An article of manufacture including a tangible, non-transitory computer-readable storage medium having instructions stored thereon that, in response to execution by a processor, cause the processor to perform operations comprising:

receiving, via the processor, one of a point cloud and a three-dimensional model for an inspected integrally bladed rotor (IBR) and a defect including a defect shape, a defect size, and a defect location;

generating, via the processor, a first finite element model and a second finite element model based on the point cloud or the three-dimensional model, the first finite element model and the second finite element model;

performing, via the processor, a structural analysis simulation with the first finite element model, wherein the first finite element model utilizes a first set of boundary conditions, wherein the first set of boundary conditions include at least one of a temperature, a rotor speed, a stack of IBRs, or a high pressure compressor, wherein the temperature includes at least one of a highest expected blade temperature or a lowest expected blade temperature, and wherein the rotor speed includes at least one of a max rotor speed, a typical rotor speed, a rotor speed as a function of flight cycle, or a rotor speed generating modal response;

performing, via the processor an aerodynamic analysis simulation with the second finite element model, wherein the second finite element model utilizes a second set of boundary conditions and wherein the second set of boundary conditions include at least one of a stack stiffness, a clocking, clearances, blade counts, axial gapping, imbalance, or secondary flow influence;

iterating, via the processor, a repaired defect shape based on simulation data from the aerodynamic analysis simulation and the structural analysis simulation; and determining a repair process for the defect based on the iterating.

2. The article of manufacture of claim 1, wherein the structural analysis simulation and the aerodynamic analysis simulation are based on boundary conditions for a gas turbine engine with the article of manufacture.

3. The article of manufacture of claim 1, wherein a potential repaired defect shape of the defect is not limited by tolerances of a product definition of an IBR design associated with the inspected IBR.

4. The article of manufacture of claim 1, wherein both the first finite element model and the second finite element model include a potential repaired defect based on the defect shape, the defect size and the defect location.

5. The article of manufacture of claim 1, wherein the first finite element model and the second finite element model include a first potential repaired defect and a second potential repaired defect.

6. The article of manufacture of claim 1, wherein the repair process for the first potential repaired defect and the second potential repaired defect is a partial repair in response to a structural criteria and an aerodynamic criteria for the inspected IBR being met in the structural analysis simulation and the aerodynamic analysis simulation.

7. The article of manufacture of claim 1, wherein the structural analysis simulation and the aerodynamic analysis simulation are performed in parallel.

8. The article of manufacture of claim 1, wherein the operations further comprise scaling, via the processor, stress results from the structural analysis simulation based on engine test data for a tested IBR on a tested gas turbine engine.

9. A method, comprising:

generating a first finite element model and a second finite element model for an inspected integrally bladed rotor (IBR) based at least in part on a point cloud of the inspected IBR;

performing a structural analysis simulation with the first finite element model, the structural analysis simulation including a first set of boundary conditions based on a first set of operating conditions of a gas turbine engine, wherein the first set of boundary conditions include at least one of a temperature, a rotor speed, a stack of IBRs, or a high pressure compressor, wherein the temperature includes at least one of a highest expected blade temperature or a lowest expected blade temperature, and wherein the rotor speed includes at least one of a max rotor speed, a typical rotor speed, a rotor speed as a function of flight cycle, or a rotor speed generating modal response;

performing an aerodynamic analysis simulation with the second finite element model, the aerodynamic analysis simulation including a second set of boundary conditions based on a second set of operating conditions of the gas turbine engine, wherein the second set of boundary conditions include at least one of a stack stiffness, a clocking, clearances, blade counts, axial gapping, imbalance, or secondary flow influence;

iterating a potential repaired defect shape for a defect of the inspected IBR based on simulation data from the aerodynamic analysis simulation and the structural analysis simulation; and generating a repair option based on the iterating.

10. The method of claim 9, wherein the repair option include one of a computer numerical control (CNC) instructions, an additive manufacturing instructions, and a manual instruction.

11. The method of claim 9, further comprising generating a plurality of repair options.

12. The method of claim 9, wherein the repair option includes coded instructions for a computer numerical control (CNC) machine to perform the repair option.

13. The method of claim 12, further comprising transferring the coded instructions to the CNC machine to perform the repair option.

14. The method of claim 13, further comprises performing the repair option via the coded instructions.

15. A method, comprising:

determining a first potential repair shape for a first defect of the inspected IBR;

determining a second potential repair shape for a second defect of the inspected IBR based on an expected impact to a predetermined parameter;

generating a first finite element model and a second finite element model for an inspected integrally bladed rotor (IBR) based at least in part on a point cloud of the inspected IBR, the first finite element model and the second finite element model including the first potential repair shape for the first defect and the second potential repair shape for the second defect;

performing a structural simulation with the first finite element model, the structural simulation including a first set of boundary conditions based on a first set of operating conditions of a gas turbine engine, wherein the first set of boundary conditions include at least one of a temperature, a rotor speed, a stack of IBRs, or a high pressure compressor, wherein the temperature includes at least one of a highest expected blade temperature or a lowest expected blade temperature, and wherein the rotor speed includes at least one of a max rotor speed, a typical rotor speed, a rotor speed as a function of flight cycle, or a rotor speed generating modal response;

performing an aerodynamic simulation with the second finite element model, the aerodynamic simulation including a second set of boundary conditions based on a second set of operating conditions of the gas turbine engine, wherein the second set of boundary conditions include at least one of a stack stiffness, a clocking, clearances, blade counts, axial gapping, imbalance, or secondary flow influence; and iterating, the second potential repair shape for the second defect based on the predetermined parameter.

16. The method of claim 15, further comprising determining a repair process for the first defect and the second defect based on the iterating.

17. The method of claim 15, wherein the predetermined parameter is an excitation frequency for a blade of the inspected IBR.

18. The method of claim 15, wherein the predetermined parameter is a vibratory stress of the inspected IBR.

19. The method of claim 15, further comprising generating a plurality of repair options in response to the iterating.

20. The method of claim 19, further comprising repairing the inspected IBR via a repair option from the plurality of repair options.

* * * * *